(12) United States Patent
Steiner et al.

(10) Patent No.: US 10,768,410 B2
(45) Date of Patent: Sep. 8, 2020

(54) DETECTION OF AMPLITUDE, REGULATION OF AMPLITUDE AND DETECTION OF DIRECTION OF AN OSCILLATION OF AN OSCILLATORY BODY

(71) Applicant: Infineon Technologies AG, Neubiberg (DE)

(72) Inventors: Christoph Steiner, St. Margarethen (AT); Stephan Gerhard Albert, Munich (DE); Franz Michael Darrer, Graz (AT); Marcus Edward Hennecke, Graz (AT); Hendrikus Van Lierop, Bj Weert (NL); Thomas Thurner, Graz (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/437,922

(22) Filed: Jun. 11, 2019

(65) Prior Publication Data
US 2020/0018948 A1    Jan. 16, 2020

(30) Foreign Application Priority Data

Jul. 13, 2018    (DE) .......................... 10 2018 211 755

(51) Int. Cl.
*G01L 1/14*    (2006.01)
*G02B 26/10*    (2006.01)
(Continued)

(52) U.S. Cl.
CPC ............ *G02B 26/0841* (2013.01); *G01L 1/14* (2013.01); *G01R 27/2605* (2013.01); *G02B 26/101* (2013.01); *H03B 5/30* (2013.01)

(58) Field of Classification Search
CPC .... B81B 2201/0221; B81B 2201/0228; B81B 2201/0235; B81B 2201/025; G01L 1/14;
(Continued)

(56) References Cited

U.S. PATENT DOCUMENTS 4,736,629 A *  4/1988  Cole .................... G01P 15/0802
                                                          324/661
5,441,300 A *  8/1995  Yokota .................. G01P 15/125
                                                          280/735
(Continued)

FOREIGN PATENT DOCUMENTS

DE    102017117697 A1    2/2019

*Primary Examiner* — Levi Gannon
(74) *Attorney, Agent, or Firm* — Harrity & Harrity, LLP

(57) ABSTRACT

A device is provided for detecting and/or regulating an amplitude of an oscillation of an oscillatory body about an oscillation axis, wherein a change in a capacitance between at least one electrode of the oscillatory body and a stationary electrode takes place during the oscillation of the oscillatory body. The device comprises a detection circuit for detecting a signal representing a measure of the change in capacitance; and an evaluation circuit for determining information from the signal, wherein the evaluation circuit is designed to calculate the amplitude of the oscillation of the oscillatory body from the determined information and an ascertained period of the oscillation of the oscillatory body and/or to regulate the amplitude of the oscillation of the oscillatory body using the determined information and the ascertained period of the oscillation of the oscillatory body.

28 Claims, 23 Drawing Sheets

(51) Int. Cl.
*H03B 5/30* (2006.01)
*G02B 26/08* (2006.01)
*G01R 27/26* (2006.01)

(58) Field of Classification Search
CPC ........ G01L 9/12; G01P 15/08; G01P 15/0802; G01P 15/125; G01R 27/26; G01R 27/2605; G02B 26/08; G02B 26/0841; G02B 26/101; H03B 5/30
USPC .......................... 324/660–662, 686; 331/154
See application file for complete search history.

(56) References Cited

U.S. PATENT DOCUMENTS

| | | | | |
|---|---|---|---|---|
| 5,492,020 | A * | 2/1996 | Okada | G01L 5/165 73/1.08 |
| 5,856,620 | A * | 1/1999 | Okada | G01P 15/125 73/514.32 |
| 6,883,638 | B1 * | 4/2005 | Maxwell | G01D 11/245 181/102 |
| 2005/0217375 | A1 * | 10/2005 | Mase | G01C 19/5719 73/504.12 |
| 2006/0109538 | A1 * | 5/2006 | Mushika | G02B 26/0841 359/291 |
| 2006/0139719 | A1 | 6/2006 | Nishio | |
| 2009/0071247 | A1 * | 3/2009 | Konaka | G01C 19/574 73/504.14 |
| 2009/0100930 | A1 * | 4/2009 | Coronato | G01C 19/5712 73/504.12 |
| 2009/0126490 | A1 * | 5/2009 | Sameshima | G01C 19/56 73/514.32 |
| 2010/0037691 | A1 * | 2/2010 | Jeong | G01C 19/5719 73/504.12 |
| 2011/0238363 | A1 * | 9/2011 | Nakamura | G01C 19/56 702/141 |
| 2017/0191830 | A1 * | 7/2017 | Maeda | G01C 19/5726 |

* cited by examiner

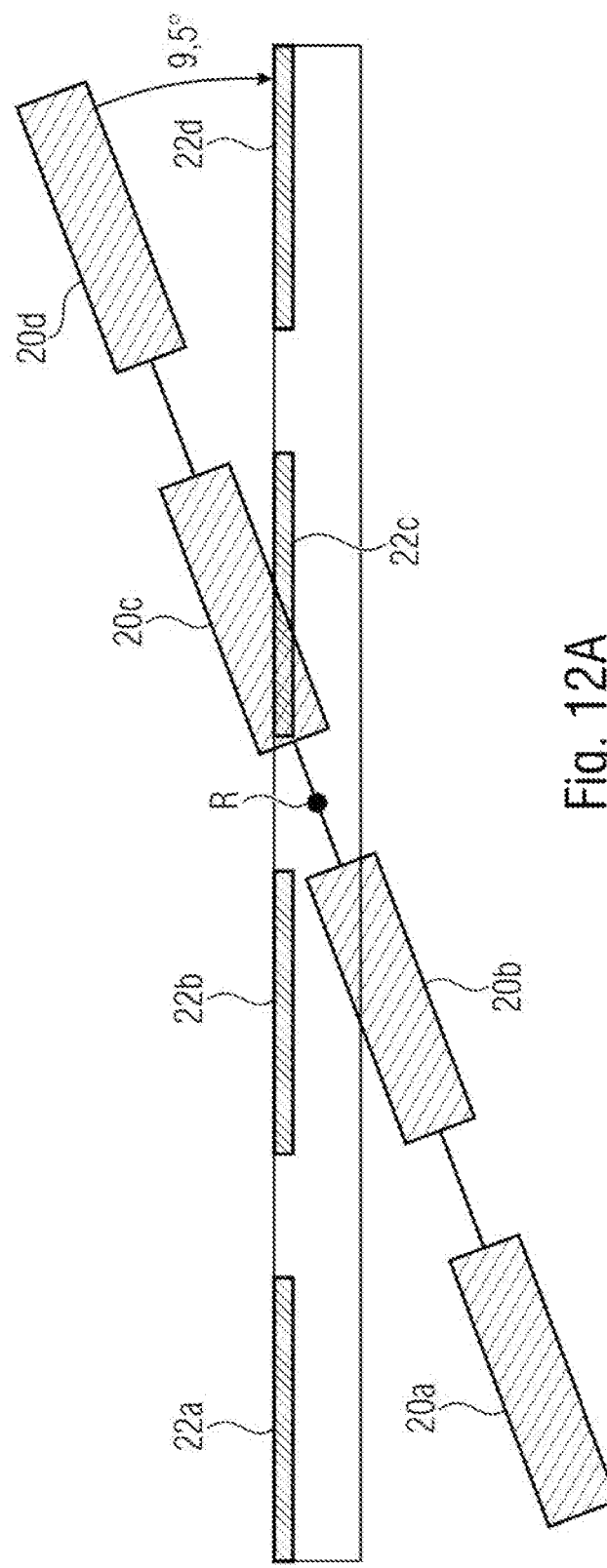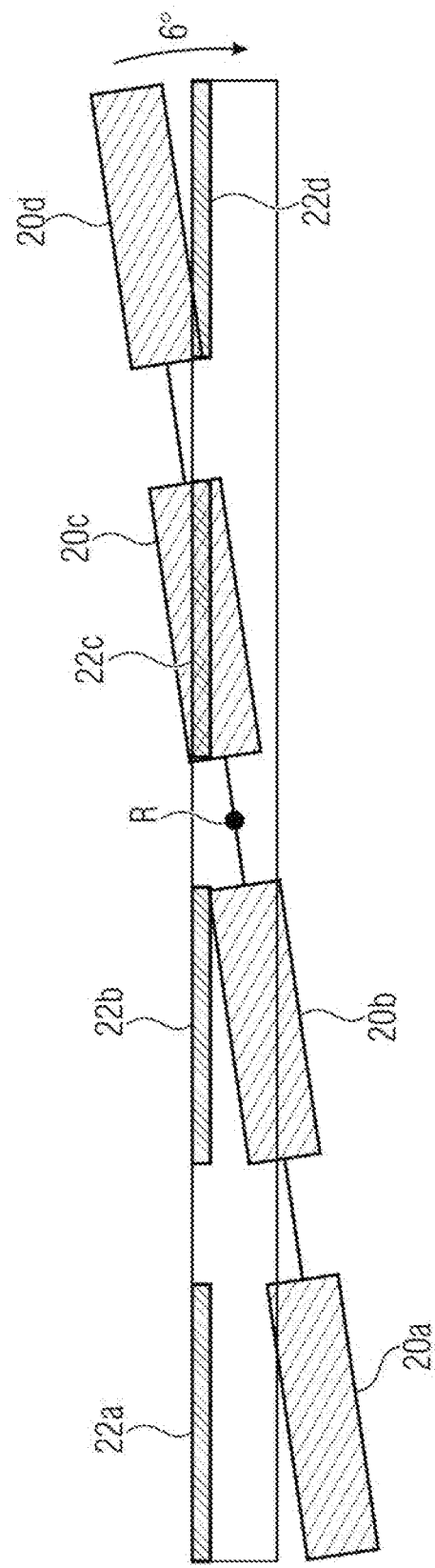
Fig. 12A
Fig. 12B

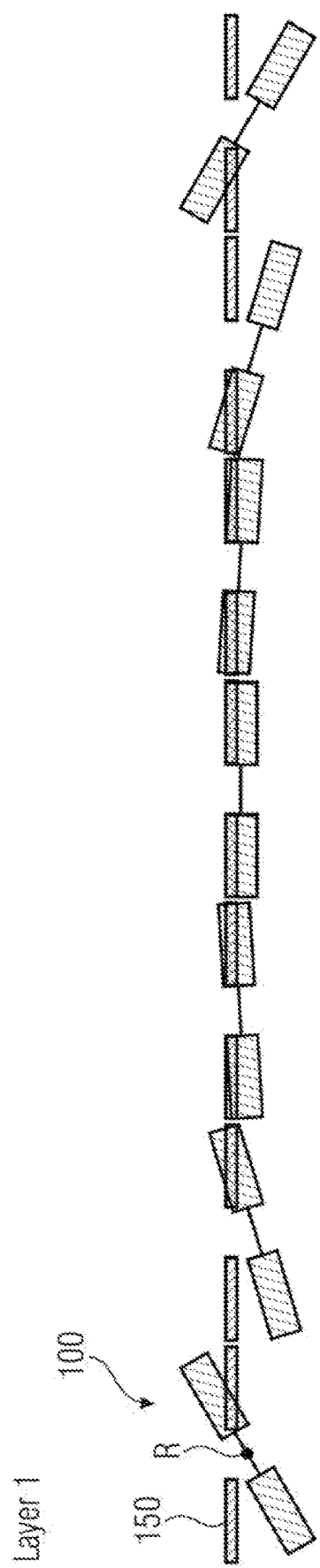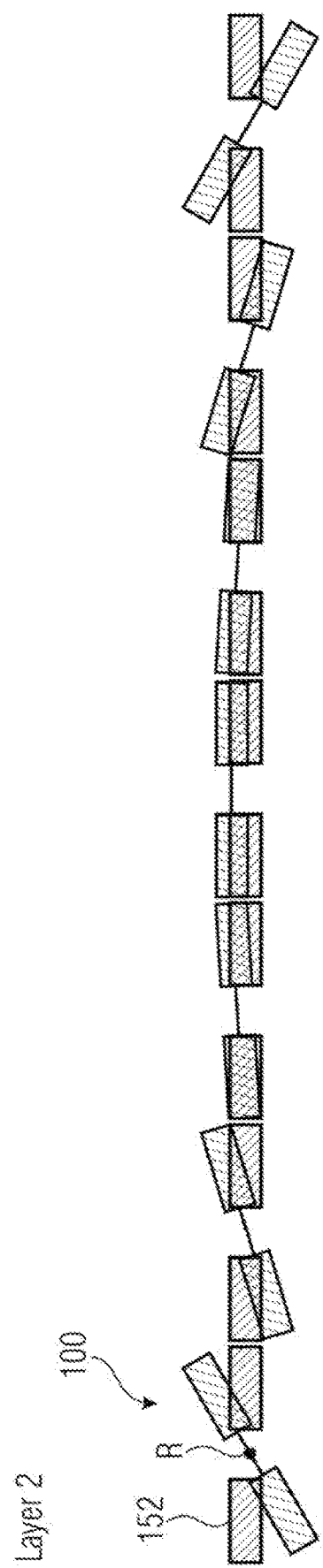

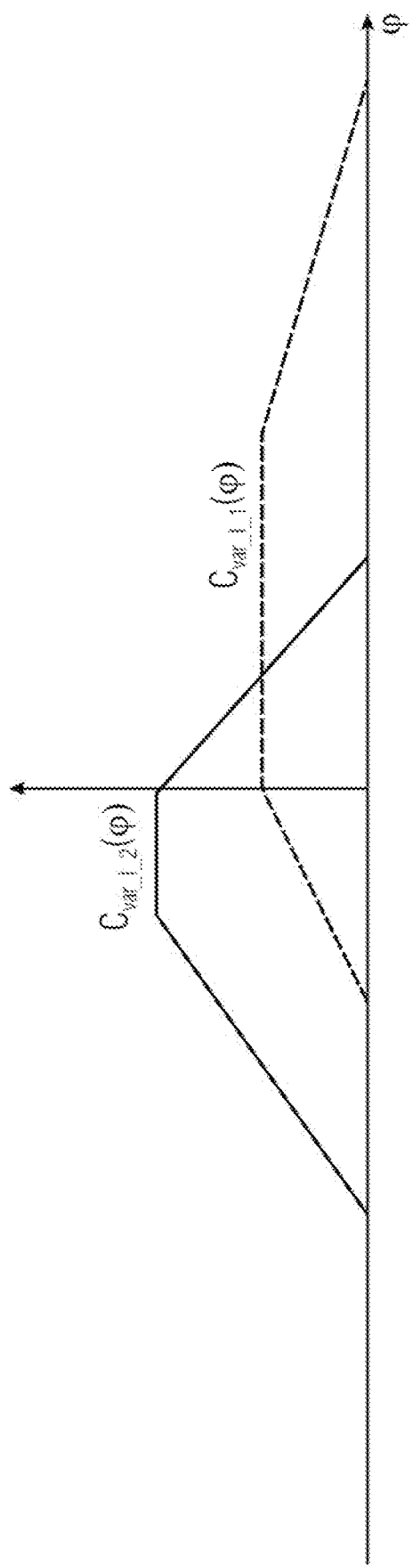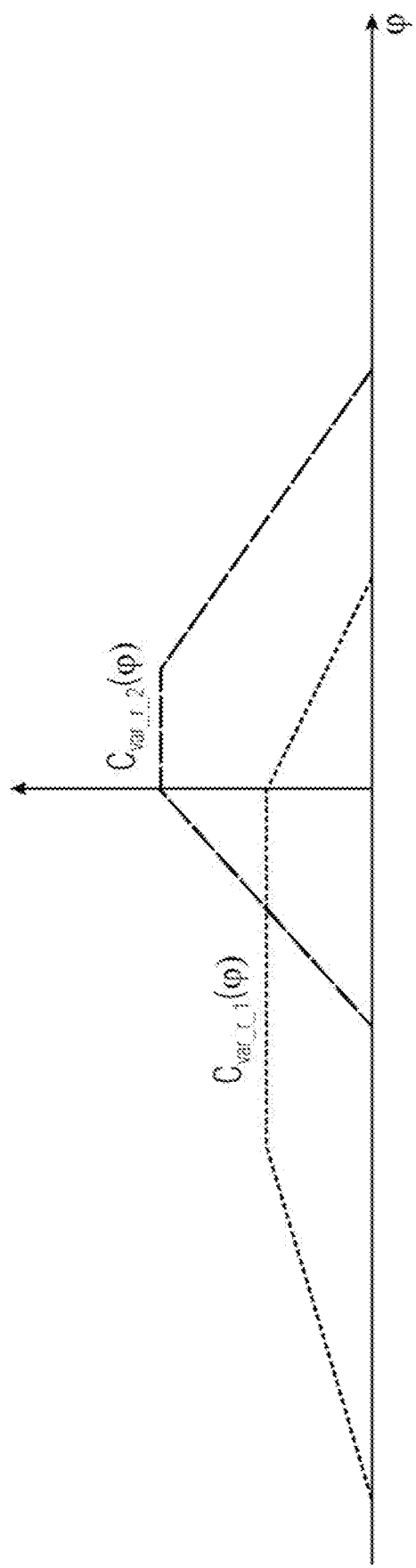

DETECTION OF AMPLITUDE, REGULATION OF AMPLITUDE AND DETECTION OF DIRECTION OF AN OSCILLATION OF AN OSCILLATORY BODY

CROSS REFERENCE TO RELATED APPLICATION

This application claims priority under 35 U.S.C. § 119 to German Patent Application No. 102018211755.1 filed on Jul. 13, 2018, the content of which is incorporated by reference herein in its entirety.

TECHNICAL FIELD

Examples of the present disclosure are concerned with devices and methods for detecting an amplitude, for regulating an amplitude and/or for detecting a direction of an oscillation of an oscillatory body which oscillates about an oscillation axis. Examples of the present disclosure relate to corresponding devices and methods in association with a MEMS element (MEMS=microelectromechanical system) comprising a body that is mechanically coupled to a carrier via a suspension structure in order to oscillate about an oscillation axis or rotation axis.

BACKGROUND

Scanning MEMS mirrors are used in numerous applications, such as e.g. video projectors, optical switches for communication networks, laser printers, laser scanners or LiDAR systems. The expression "LiDAR" can be regarded as an artificial word composed of the expressions "light" and "radar". LiDAR methods can be regarded as monitoring methods which measure a distance to a target by illuminating the target with pulsed laser light and detecting the reflected pulses using a sensor. In this case, laser light is directed onto a mirror that is caused to oscillate using a mirror drive and deflects the light beam toward the left and toward the right. In this way, a region in front of the system is scanned by the laser. The angle between the outermost left and the outermost right point of the region is referred to as the field of view. The angle is double the magnitude of the maximum deflection angle of the mirror. If a mirror oscillates between −10° and +10°, for example, the laser is deflected between −20° and +20° and the field of view is 40°. It is desirable to ensure a specific field of view. The field of view is defined by the amplitude of the oscillation, e.g. the maximum inclination angle of the oscillation. Therefore, the mirror drive should have a unit for detecting the mirror inclination angle and for regulating the maximum inclination angle or the amplitude of the mirror oscillations on the basis thereof. By way of example, a specific application may have a field of view of 40°. The objective of amplitude regulation is then to ensure that the mirror is inclined in such a way that this field of view is attained with a sufficient accuracy.

Various methods have been implemented for driving such mirrors and detecting the position of the mirror. One such method is a capacitive drive. In the case of a capacitive drive, the mirror is driven by electrostatic forces that pull the mirror. A set of fingers connected to the mirror (the rotor) overlaps a set of static fingers on a frame, the stator. Since the sets of fingers have the forms of combs, this type of drive is also referred to as a comb drive.

When the mirror moves in from its highest inclination angle (in the direction of its rest position), a constant voltage is applied between the rotor and the stator, such that the rotor is attracted by the stator. When the mirror oscillates through its zero position, the voltage is switched off and the mirror oscillates freely out into the opposite position. When the mirror begins to oscillate back, the voltage is switched on again. The highest oscillation amplitude can be attained if the frequency of the actuation voltage is equal to double the resonant frequency of the mirror. However, this type of resonance operation is not a prerequisite.

Overview

Devices and methods which make it possible to detect an oscillation amplitude and/or oscillation direction of an oscillatory body would be desirable.

Examples of the present disclosure provide a device for detecting and/or regulating an amplitude of an oscillation of an oscillatory body about an oscillation axis, wherein a change in a capacitance between at least one electrode of the oscillatory body and a stationary electrode takes place during the oscillation of the oscillatory body. The device comprises a detection circuit for detecting a signal representing a measure of the change in capacitance.

The device furthermore comprises an evaluation circuit for determining information from the signal, the information being a measure of a time interval between a predetermined event in the signal corresponding to an angular position of the oscillatory body and a point in time of a crossing through a reference position of the oscillation. The evaluation circuit is designed to calculate the amplitude of the oscillation of the oscillatory body from the determined information and an ascertained period of the oscillation of the oscillatory body and/or to regulate the amplitude of the oscillation of the oscillatory body using the determined information and the ascertained period of the oscillation of the oscillatory body.

Examples of the present disclosure are based on the insight that, by detecting a time interval between a predetermined event and a point in time of a crossing through a reference position, it is possible to determine the amplitude of the oscillation independently of influencing parameters, such as e.g. an air pressure, and/or to regulate the amplitude using this detected time interval. Consequently, examples of the present disclosure enable an accurate determination of the amplitude even in the case of variable ambient parameters. Furthermore, examples of the present disclosure enable a calibration of the angular position.

Examples of the present disclosure provide a device for detecting a direction in which an oscillatory body moves during an oscillation about an oscillation axis, the device comprising an oscillatory body, a first stationary electrode and a second stationary electrode, a detection circuit and an evaluation circuit. The oscillatory body comprises at least one movable electrode. The first stationary electrode is arranged on a first side of the oscillation axis. A first change in a capacitance between the movable electrode and the first stationary electrode and a second change in capacitance between the movable electrode and the second stationary electrode take place during the oscillation of the oscillatory body. The detection circuit is designed to detect a first signal representing a measure of the first change in capacitance over time before a crossing through a reference position of the oscillation, and a second signal representing a measure of the second change in capacitance over time before the crossing through the reference position of the oscillation. The evaluation circuit is designed to determine the direction in which the oscillatory body moves during the oscillation before the crossing through the reference position of the oscillation, using the detected first and second signals.

Examples of the present disclosure thus make it possible to determine the direction of movement of an oscillatory body before a crossing through a reference position in a simple manner.

Examples of the disclosure provide a MEMS device comprising a corresponding device for detecting an amplitude of an oscillation of the oscillatory body, and a driver device designed to drive the oscillatory body, wherein the driver device comprises the electrode of the oscillatory body, the stationary electrodes and a driver circuit designed to apply a variable voltage between the electrode of the oscillatory body and the stationary electrodes.

Examples of the present disclosure provide a method for detecting and/or regulating an amplitude of an oscillation of an oscillatory body about an oscillation axis, wherein a change in a capacitance between at least one electrode of the oscillatory body and a stationary electrode takes place during the oscillation of the oscillatory body, wherein the method has the following features: detecting a signal, representing a measure of the change in capacitance, over time; determining information that is a measure of a time interval between a point in time of a predetermined event in the signal corresponding to an angular position of the oscillatory body and a point in time of a crossing through a reference position of the oscillation; determining a period of the oscillation; and calculating the amplitude of the oscillation of the oscillatory body on the basis of the determined information and the period of the oscillation and/or regulating the amplitude of the oscillation of the oscillatory body using the determined information and the ascertained period of the oscillation of the oscillatory body. Consequently, examples of the present disclosure enable an accurate determination and/or regulation of the amplitude even in the case of variable ambient parameters.

Examples of the present disclosure provide a method for detecting a direction in which an oscillatory body moves during an oscillation about an oscillation axis, wherein the oscillatory body comprises at least one movable electrode, wherein a first stationary electrode is arranged on a first side of the oscillation axis and a second stationary electrode is arranged on a second side of the oscillation axis, wherein a first change in a capacitance between the movable electrode and the first stationary electrode and a second change in capacitance between the movable electrode and the second stationary electrode take place during the oscillation of the oscillatory body, wherein the method has the following features: detecting a first signal representing a measure of the first change in capacitance over time before a crossing through a reference position of the oscillation; detecting a second signal representing a measure of the second change in capacitance over time before the crossing through the reference position of the oscillation; and determining the direction in which the oscillatory body moves during the oscillation before the crossing through the reference position of the oscillation, using the detected first and second signals.

BRIEF DESCRIPTION OF THE DRAWINGS

Examples of the disclosure are described below with reference to the accompanying drawings, in which:

FIGS. 12A and 12B show schematic illustrations for elucidating an oscillatory movement of an oscillatory body in a first direction;

FIGS. 16A and 16B show schematic illustrations for elucidating one example of a multilayered system;

FIGS. 17A and 17B show capacitance profiles during an oscillation of the example shown in FIGS. 16A and 16B;

DETAILED DESCRIPTION

Examples of the present disclosure are described below in detail and using the accompanying drawings. It should be pointed out that identical elements or elements having the same functionality are provided with identical or similar reference signs, wherein a repeated description of elements provided with identical or similar reference signs is typically omitted. Descriptions of elements having identical or similar reference signs are mutually interchangeable. In the following description, many details are described in order to afford a more thorough explanation of examples of the disclosure. However, it is obvious to those skilled in the art that other examples can be implemented without these specific details. Features of the different examples described can be combined with one another, unless features of a corresponding combination are mutually exclusive or such a combination is expressly excluded.

Figure 1:
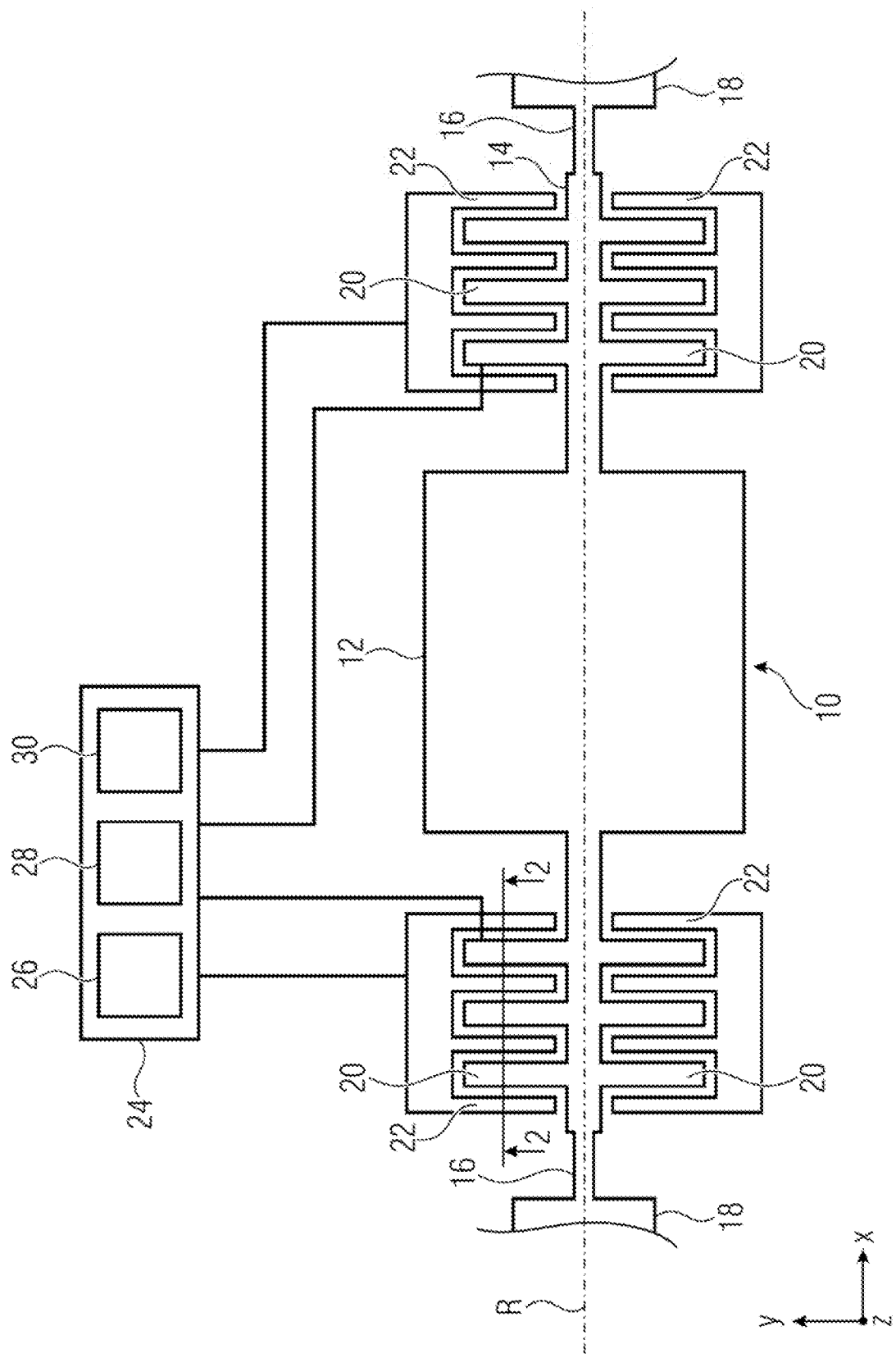
FIG. 1 shows a schematic plan view of one example of a device for detecting an amplitude of an oscillation of an oscillatory body.

FIG. 1 shows a schematic plan view of a device for detecting and regulating an amplitude of an oscillation of an oscillatory body 10. The oscillatory body 10 is capable of oscillating or rotatable about an oscillation axis R. The oscillatory body 10 can comprise a mirror 12, for example. The oscillatory body 10 furthermore comprises a carrier beam 14, which carries the mirror 12. The carrier beam 14 is mounted on a carrier frame 18 by way of torsion beams 16. The torsion beams 16 enable the oscillatory body 10 to oscillate about the oscillation axis R. The oscillatory body comprises at least one movable electrode situated opposite a stationary electrode. In the example shown, the oscillatory body 10 comprises comb electrodes 20 having electrode fingers, which are arranged interdigitally with electrode fingers of stationary comb electrodes 22 and form a comb drive. The stationary comb electrodes 22 can be secured for example to the carrier frame 18 in a stationary fashion. Respective electrode surfaces of the comb electrodes 20 and 22 are situated opposite one another, such that a capacitance is formed between same. If the oscillatory body 10 oscillates about the oscillation axis R, a change in the capacitance between the comb electrodes 20 of the oscillatory body and the stationary comb electrodes 22 takes place. The comb electrodes 20 thus constitute electrodes of the rotor, while the comb electrodes 22 constitute electrodes of the stator.

The device comprises a circuit 24 comprising a detection circuit 26 and an evaluation circuit 28. As is shown schematically in FIG. 1, the circuit 24 is electrically connected to the electrodes in order to detect a signal representing a measure of the change in capacitance between the electrodes. By way of example, the detection circuit 26 can be designed to measure a current between the comb electrodes 20, 22, wherein the current represents a measure of the change in capacitance. The evaluation circuit 28 is designed to determine information from the signal detected by the detection circuit 26, the information being a measure of a time interval between a predetermined event in the signal corresponding to an angular position of the oscillatory body 10 and a point in time of a crossing through a reference position of the oscillation. The evaluation circuit 28 is designed to calculate the amplitude of the oscillation of the oscillatory body 10 from the determined information and an ascertained period of the oscillation of the oscillatory body 10 and/or to regulate the amplitude of the oscillation of the oscillatory body 10 using the determined information and an ascertained period of the oscillation of the oscillatory body.

Figure 2:
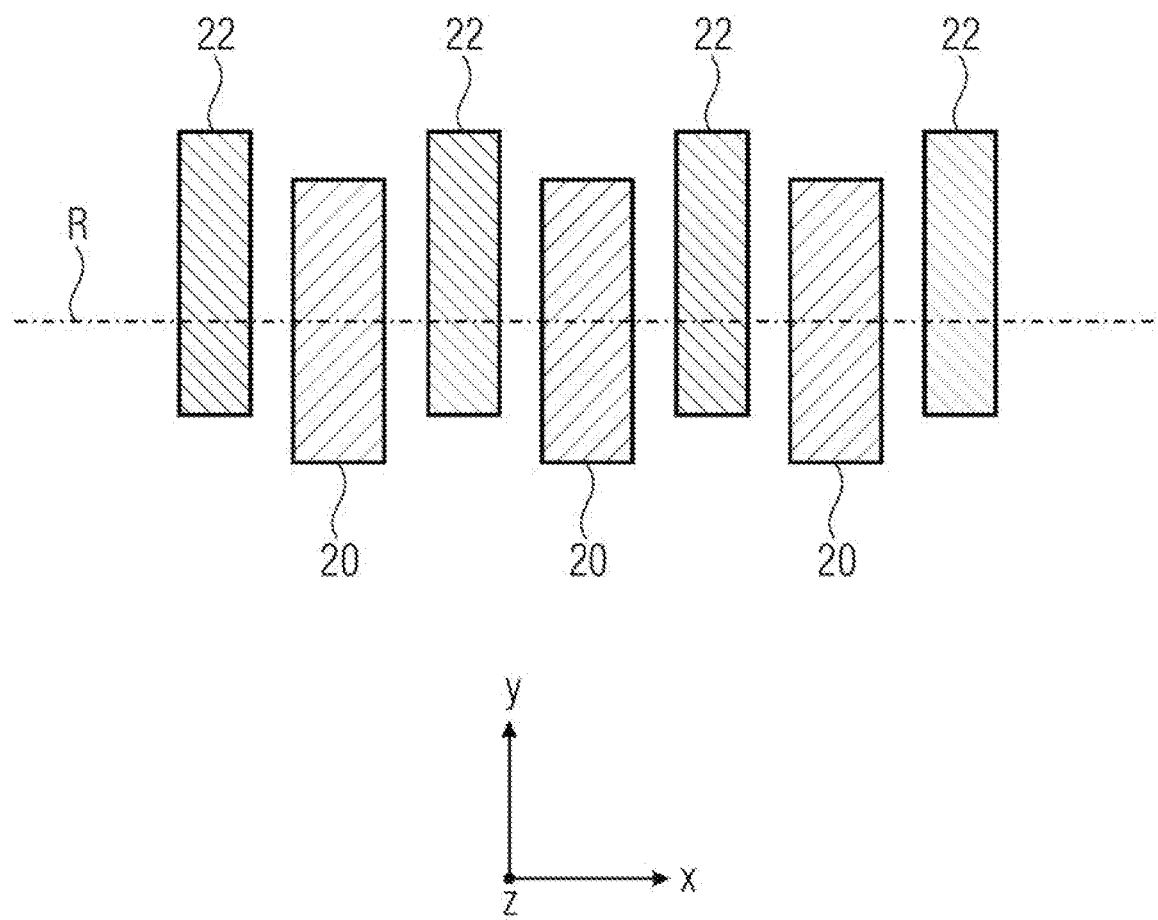
FIG. 2 shows a schematic cross-sectional view along a line 2-2 in FIG. 1.

FIG. 2 schematically shows a cross section through that part of the comb drive shown in FIG. 1 which is marked by the line 2-2. As is shown in FIG. 2, the comb electrode 22, which is symmetrical with respect to the oscillation axis in the x-y-plane, can be arranged asymmetrically relative to the oscillation axis R in the x-z-plane. In other words, the mean value in the z-direction that results from the two ends of a comb electrode 22 (mean centroid) is offset with respect to the oscillation axis R in the rest position (deflection 0°).

The comb electrodes 20, 22 form a capacitive drive that can drive the oscillatory body 10 by periodically applying a constant voltage between rotor electrode 20 and stator electrode 22, such that the rotor is attracted by the stator when it is in a deflected state. When the mirror moves in from its highest inclination angle (in the direction of its rest position), a constant voltage is applied between the rotor and the stator, such that the rotor is attracted by the stator. When the mirror oscillates through its zero position, the voltage is switched off and the mirror oscillates freely out into the opposite position. When the mirror begins to oscillate back, the voltage is switched on again. The highest oscillation amplitude can be attained if the frequency of the actuation voltage is equal to double the resonant frequency of the mirror. However, this type of resonance operation is not a prerequisite. The circuit 24 can comprise a drive circuit 30 in order to apply corresponding voltages between the rotor electrodes 20 and the stator electrodes 22. The evaluation circuit 28 can be designed to control or to regulate the drive circuit 30 in order to obtain a target oscillation amplitude of the oscillation of the oscillatory body.

In examples, the oscillatory body 10 can be formed in a substrate in which the carrier frame 18 is also formed. In examples, the electrodes 20, 22 can include a doped semiconductor material. In examples, both the rotor electrodes 20 and the stator electrodes 22 can comprise a plurality of conductive layers which are arranged above one another and which can be separated in each case by an insulating layer.

Figure 3:
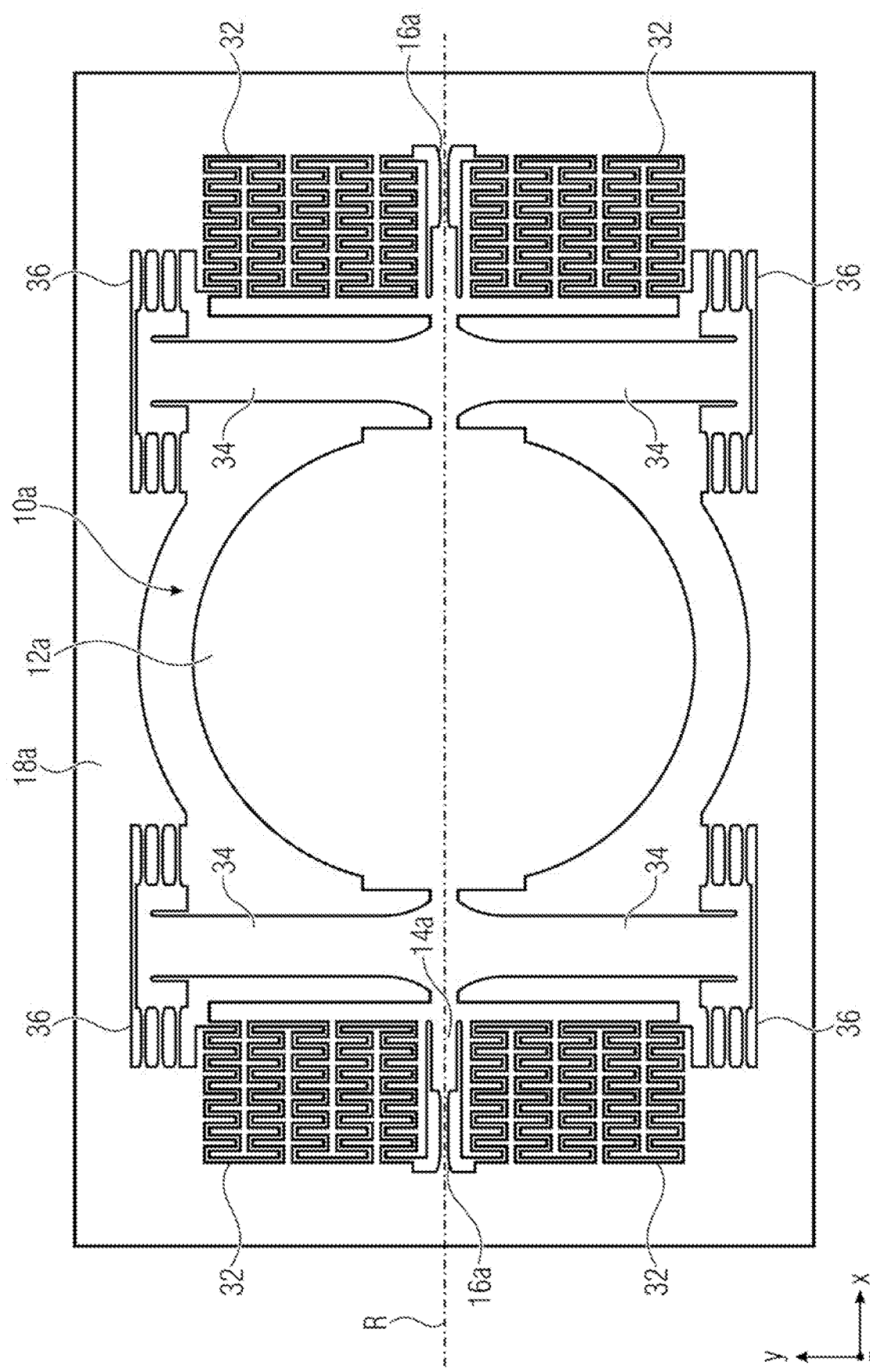
FIG. 3 shows a schematic plan view of one example of a MEMS scanning mirror.

An alternative example of a MEMS scanning mirror is shown in FIG. 3. The example shown in FIG. 3 comprises an oscillatory body 10a mounted on a carrier frame 18a by way of torsion beams 16a, such that it is capable of oscillating about an oscillation axis R. A mirror 12a of the oscillatory body 10a is in turn mounted on a carrier beam 14a. Furthermore, movable comb electrodes are in turn fitted to the carrier beam 14a and together with stationary comb electrodes on the carrier frame 18a form a comb drive 32. In order to increase stability, in the example shown, the carrier beam 14a is furthermore mechanically coupled to the carrier frame 18a by way of leaf springs 34 and load relieving springs 36. In the example shown, the rotation axis extends in the x-direction, the leaf springs 34 extend in the y-direction, and spring beams of the load relieving springs 36 extend in the x-direction. The torsion beams 16a extend in the x-direction, such that the oscillatory body 10a is capable of oscillating about the oscillation axis R.

The examples shown in FIGS. 1 and 3 are merely by way of example for possible configurations of oscillatory bodies and the present disclosure is not limited thereto. Examples of the present disclosure use an oscillatory body that is pivotable about an oscillation axis, wherein such oscillatory bodies are also referred to as 1D oscillatory bodies. Examples of the disclosure can also be applied to oscillatory bodies having more than one oscillation axis, for example oscillatory bodies having two oscillation axes, so-called 2D oscillatory bodies.

Examples of the present disclosure are described below with reference to mirrors. Other examples may relate to other MEMS components comprising an oscillatory body, for example an oscillatory body configured to act on a fluid in order to achieve a ventilation effect, for example, or to open and close a fluid path.

Examples comprise a capacitive drive that can simultaneously be used to carry out a detection. The detection can serve a number of purposes:
- to detect when the drive voltage is to be switched on and off;
- to determine in what direction the mirror points at any specific time, e.g. left/right;
- as input signals for a control loop that ensures a desired oscillation amplitude; and
- optionally also for monitoring the intactness of the mirror.

Figure 4:
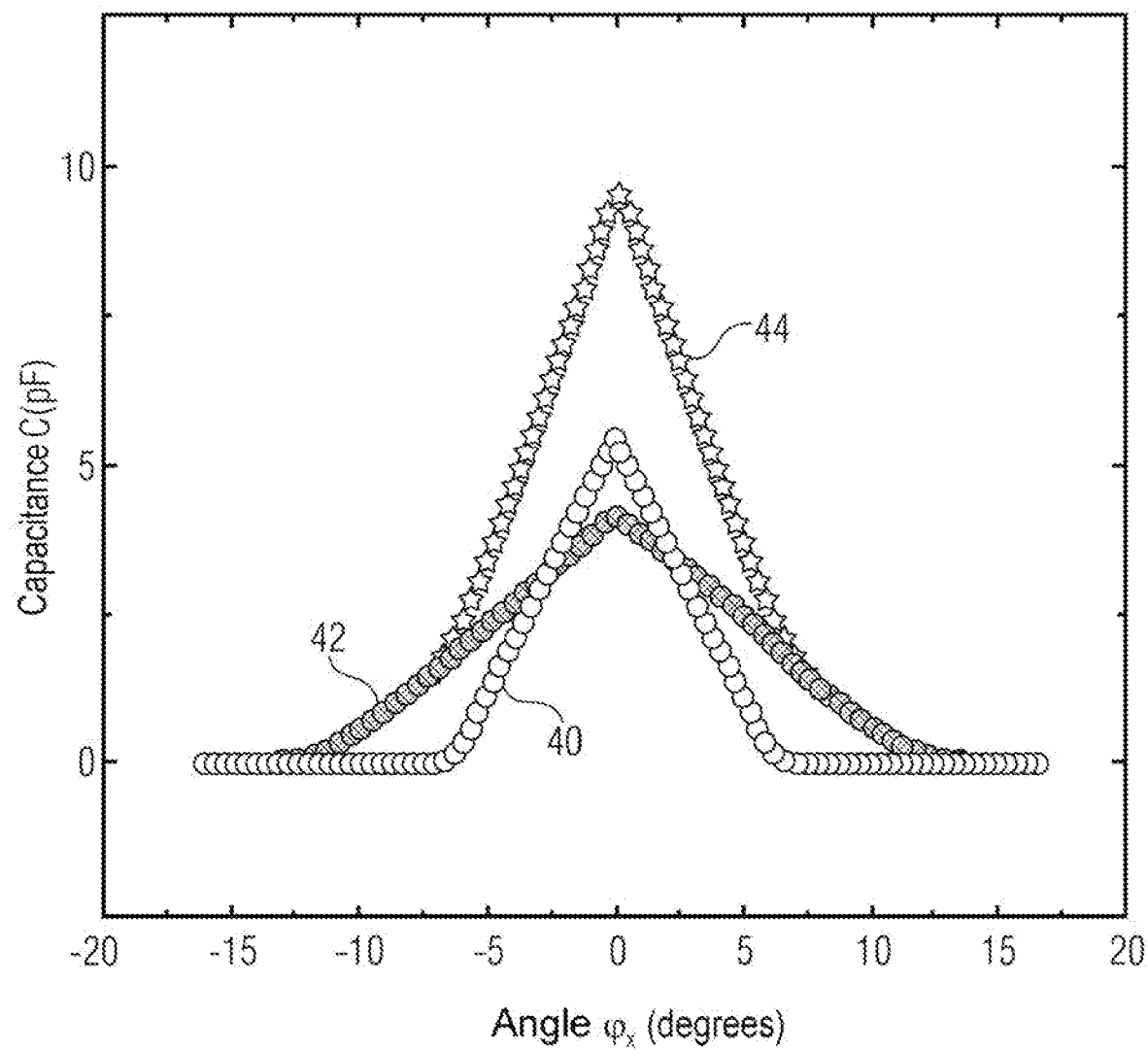
FIG. 4 shows diagrams showing the capacitance between movable electrode and stationary electrode of oscillatory bodies versus the deflection angle $\varphi_x$.

For detection purposes, in the case of a capacitive drive, the capacitance could be measured in order to detect the inclination angle of the mirror. FIG. 4 shows typical curves for the capacitance of a comb drive as a function of the inclination angle. In this case, the curve 40 shows the capacitance of a series of fingers arranged further away from the oscillation axis, while curve 42 shows the capacitance of a series of fingers arranged closer to the oscillation axis. As shown by curve 40, the capacitance decreases rapidly when the oscillatory body moves away from the zero angle, and reaches zero in the case of smaller angles than a series of fingers arranged nearer to the axis, as is shown by the curve 42. Curve 44 in FIG. 4 shows the total capacitance of a comb drive having two corresponding series of fingers and is a superimposition of the curves 40 and 42. One example of a comb drive having two series of fingers, one of which is closer to an oscillation axis than the other, is described below with reference to FIG. 11.

A measurement of the capacitance of a comb drive basically makes it possible to estimate the inclination angle of the mirror. On the basis thereof, the maximum inclination angle of the mirror can be regulated to a desired value. However, two shortcomings exist here. Since the capacitance curve is symmetrical, it is not possible to detect the direction in which the mirror is pivoted, left or right. Furthermore, the capacitance becomes zero toward larger angles, such that a detection is no longer possible. Examples of the present disclosure afford a possibility of detecting the exact inclination angle independently of ambient conditions.

In examples of the present disclosure, a charging current via the respective capacitance is measured as a signal representing a measure of a change in capacitance. This enables the detection in a simple manner. However, importance is not attached to a specific method for detecting the capacitances in order to derive a change in capacitance therefrom. As a measure of the change in capacitance, the time derivative of the capacitance can be detected, which is done in examples by measuring the total charging current of the capacitances. The charging current of each capacitor can be derived as:

$$I = \frac{dQ}{dt} = \frac{d}{dt}CU = U\frac{dC}{dt} + C\frac{dU}{dt} = U\frac{dC}{dt}$$

wherein the last equals sign holds true if the actuation voltage U in the switched-on state is constant over time. It should be noted that during the times when the actuation voltage is switched off, the charging current is zero.

A diagram of a typical charging current is shown in FIGS. 5 to 8, 14, 15, and 20 to 23 each show the derivative of the capacitance over time, which, multiplied by the actuation voltage U, corresponds to the charging current. Since the voltage in the switched-on state is constant, the charging current represents a measure of the change in capacitance. In examples, the derivative of the capacitance over time is detected by the measurement of a current between two electrodes.

Figure 5:
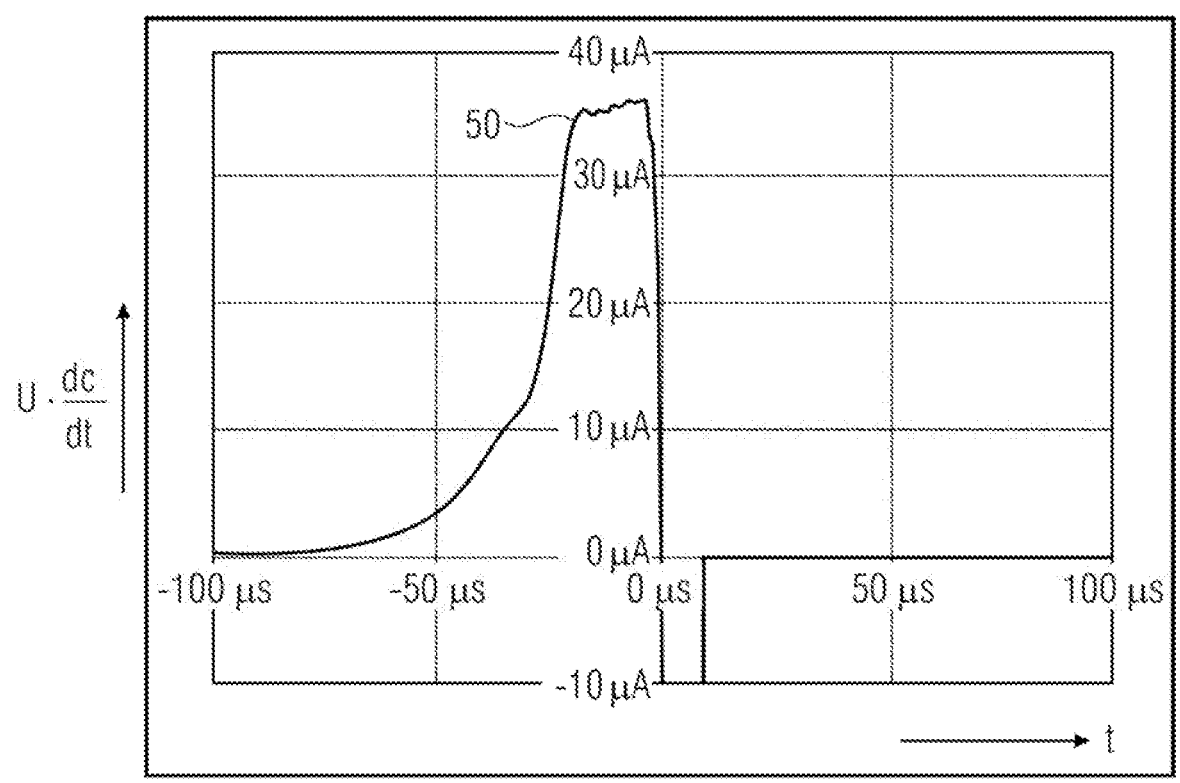
FIG. 5 shows a diagram showing a typical profile of a change in capacitance between movable electrode and stationary electrode for one example of an oscillatory body.
Figure 6:
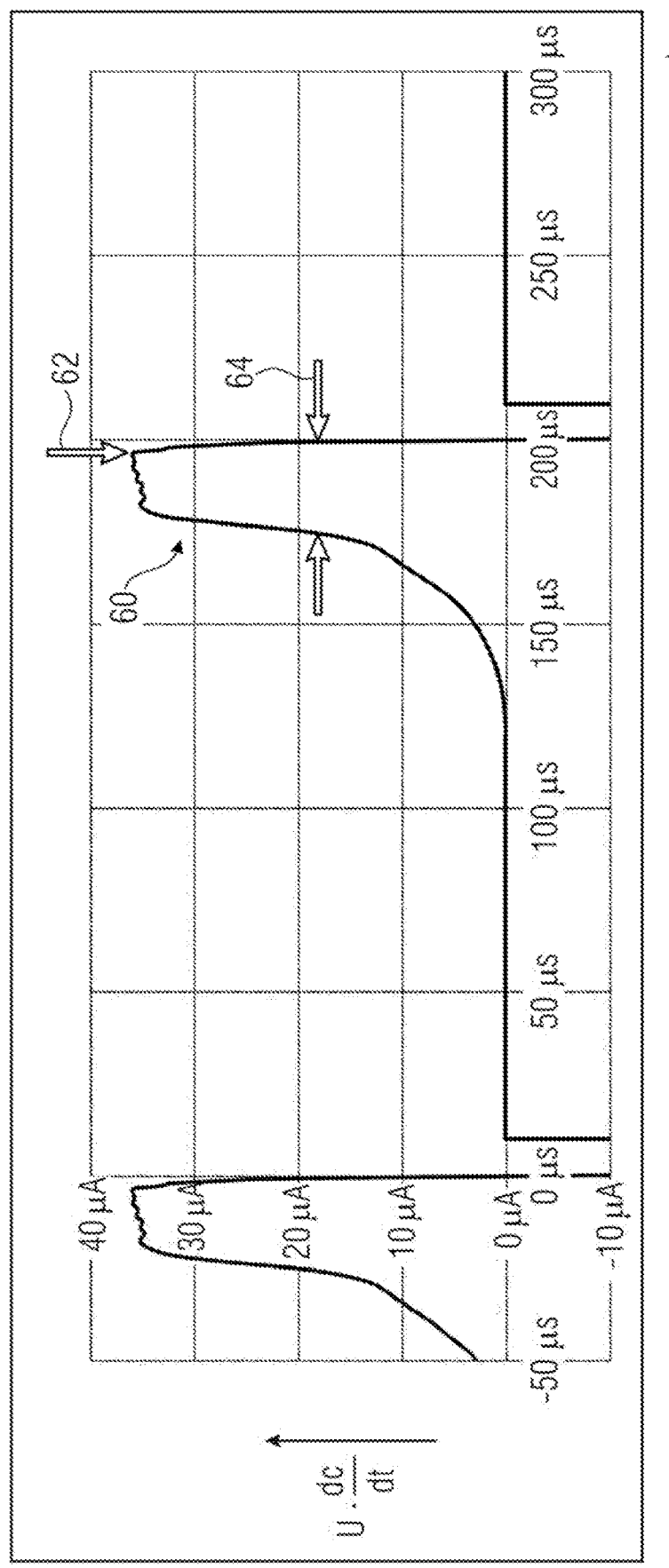
FIGS. 6-8 show diagrams of corresponding profiles of a change in capacitance over time for elucidating examples of the present disclosure.

At the beginning of the curve shown in FIG. 5, at the point in time −100 µs, the mirror oscillates from the outermost position, in which the fingers of the comb drive are not engaged, inward. When the fingers begin to engage, the capacitance of the comb drive begins to build up and the charging current increases rapidly. In a specific time range, the capacitance increases virtually linearly and the charging current reaches a plateau at 50 in the meantime. Just before the mirror oscillates through the angle of zero degrees, the charging current falls rapidly and at 0° it has a zero crossing and changes its sign. A short time after the zero crossing, the actuation voltage is switched off and the charging current likewise reaches 0 amperes following the peak caused by C*dU/dt.

A beneficial property of the derivative of the drive capacitance is that its zero crossing directly indicates the zero crossing of the mirror. The zero crossing of the mirror is that position of the mirror at which the deflection angle thereof is 0°. The point in time of the zero crossings of the mirror can thus be determined with high accuracy.

There is no need for separate explanation that, in examples, the drive of the oscillatory body can comprise a plurality of movable and stationary comb electrodes, two of which respectively form a pair between which the charging current is measured. In examples, all of the measured charging currents are added in order to detect the signal representing a measure of the change in capacitance.

As has been mentioned, in examples of the present disclosure, the charging current is measured in order to determine the change in capacitance. It should be noted, however, that the change in capacitance could also be measured in a different way. By way of example, a separate coil having an inductance L of an LC oscillator having a frequency of $$f = \frac{1}{2\pi\sqrt{LC}}; \frac{df}{dt} = -\frac{1}{4\pi C\sqrt{LC}}\frac{dC}{dt}$$

could be set. One advantage of such a solution approach would be that the capacitance of the comb drive could be measured at all times independently of the actuation voltage. However, the derivative would have to be explicitly calculated, while the measured charging currents already represent the derivative.

One simple possibility for measuring and regulating the amplitude of the mirror would involve measuring the height of the plateau 50, e.g. the maximum value. This value represents the speed of the mirror just before the zero crossing. After the mirror moves through the zero crossing at this speed, it oscillates out into the opposite position. The maximum inclination angle achieved by the mirror is directly dependent on the speed of the mirror at the zero crossing. If the speed and thus the maximum value of the charging current are kept constant from one cycle to the next, the maximum inclination angle of the mirror is likewise constant. It is disadvantageous, however, that at a given mirror speed the maximum inclination angle is also dependent on ambient conditions. If the air pressure increases, the damping increases, such that for the same zero crossing speed the mirror no longer attains the same maximum inclination angle.

Alternatively, values of the charging current could be measured at two predefined points in time, one at the rising edge and one at the falling edge of the pulse. The difference between the two currents measured at these two times is a measure of the maximum inclination angle of the mirror. This method would be inadequate, however, since the point in time of the measurements would have to be very exact. Since the edges rise and fall very rapidly, a small error in the points in time at which measurement is carried out results in a large error in the current measurements.

Examples of the present disclosure utilize specific properties of the capacitance derivative curves in order to estimate and/or regulate the maximum inclination angle of the mirror, that is to say the amplitude thereof. It has been recognized that in capacitance derivative curves of capacitively driven oscillatory bodies, predetermined events occur whose point in time corresponds to a specific angular position of the oscillatory body. In examples of the present disclosure, this predetermined event can be for example a maximum of a pulse of the capacitance derivative curve, a rising edge of the pulse of the capacitance derivative curve or a position of the pulse of the capacitance derivative curve. This example thus involves a predetermined event, at an angular position lying between the zero crossing and the maximum deflection. The time interval between this predetermined event and another event, namely the crossing of the oscillatory body through a reference position, represents a measure of the amplitude of the oscillation of the oscillatory body. In examples, the reference position can be the zero crossing of the oscillation of the oscillatory body. In examples, this crossing through the reference position can correspond to a point in time at which a falling edge in the pulse falls below a threshold, or to a point in time at which the capacitance derivative curve has a zero crossing. This zero crossing can correspond to the actual zero crossing of the oscillation.

Examples of the disclosure involve seeking the point in time of steep edges in the time derivative of the capacitance curve. The present disclosure is based on the insight that specific events in the derivatives correspond to specific inclination angles of the mirror. That is to say, in other words, that if such an event is detected, it is known that the mirror has attained a specific inclination angle at this point in time. From this point in time relative to the point in time of a reference position of the mirror, it is possible to calculate the maximum inclination angle for the instantaneous oscillation, e.g. the amplitude, of the mirror taking account of the present period duration of the oscillation. In examples, the reference position is a deflection of the mirror of 0° and the crossing through the reference position is the zero crossing. In other examples, a reference position could also be a maximum value of the capacitance derivative or a point of inflection of the capacitance derivative.

If a specific oscillation amplitude is required, it is alternatively possible to calculate in advance the expected point in time of the specific event, wherein an amplitude regulation can then be configured to ensure, using suitable control, that the event takes place at the expected point in time. In examples, the amplitude of the oscillation can thus be regulated directly depending on the determined information and the oscillation duration. In examples of the present disclosure, the comb drive can comprise one or more layers, as will also be discussed below.

In examples, the predetermined event is assigned to an angular position that is different than zero, wherein an angular position of zero corresponds to a rest state of the oscillatory body. In examples, the predetermined event is thus an event that is different than a zero crossing of the oscillation. Furthermore, in examples, the predetermined event is an event that is different than reaching the maximum deflection.

In examples of the present disclosure, the predetermined event is a rising edge of a pulse which occurs in the charging signal before the mirror passes through its zero position. In examples, the rising edge can be detected by comparing the signal with a threshold. The time interval between the position at which the signal exceeds the threshold and the zero crossing of the signal can then represent the detected information.

In examples of the present disclosure, the evaluation circuit is designed to ascertain a pulse width 64 of the pulse 60 in the signal before a crossing through the reference position (zero crossing) of the oscillation, wherein the pulse width represents the detected information. One such example will now be explained with reference to FIG. 6. In this case, firstly a maximum value 62 of the charging current 60 can be measured. A threshold can be derived therefrom, which threshold is half of the maximum value, for example. The pulse of the charging current can then be compared with the threshold and the pulse width can be ascertained therefrom. In examples, the evaluation circuit can thus be designed to measure a maximum value of the signal, to define a threshold using the maximum value, to carry out a threshold value comparison of the signal with the threshold, and to ascertain the pulse width using the result of the threshold value comparison.

In examples, the predetermined event can thus be the commencement of the increase in the capacitance, e.g. the rising edge, which indicates the start of the commencing engagement of the fingers of the comb drive. This event occurs at the same angle and is dependent only on the design of the comb drive. It is completely independent of pressure, temperature or moisture. Since the rising edge is very steep, the exact value of the threshold is not critical since it has a small influence on the measurement time.

The second event indicating the crossing of the oscillatory body through the reference position of the oscillation can be the falling edge of the pulse 60. In examples, the evaluation circuit can thus be designed to ascertain the pulse width 64 between a first point in time, at which the signal exceeds the threshold, and a second point in time, at which the signal falls below the threshold again. The pulse width can then represent the information that is a measure of a time interval between a predetermined event, e.g. the rising edge, in the signal corresponding to an angular position of the oscillatory body and a point in time of a crossing through a reference position of the oscillation.

Figure 7:
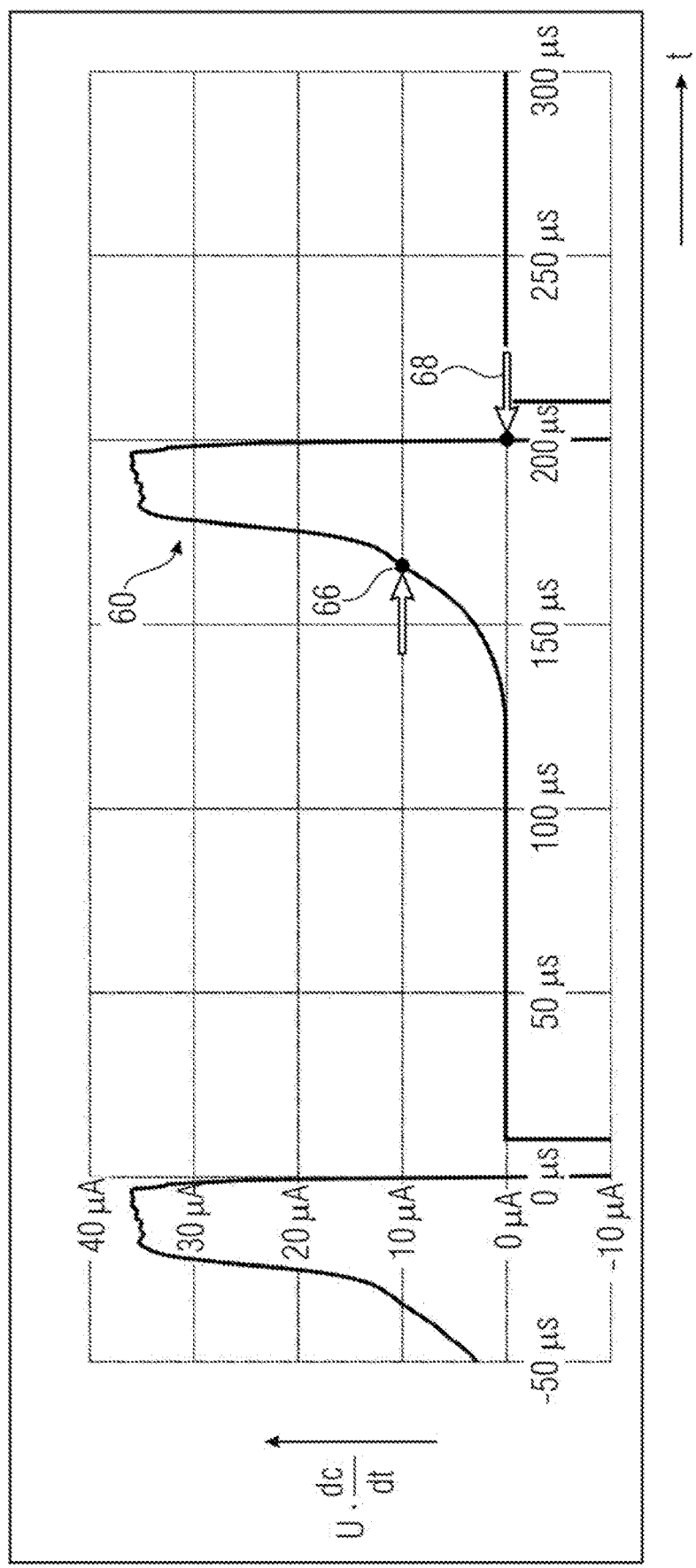
Figure 8:
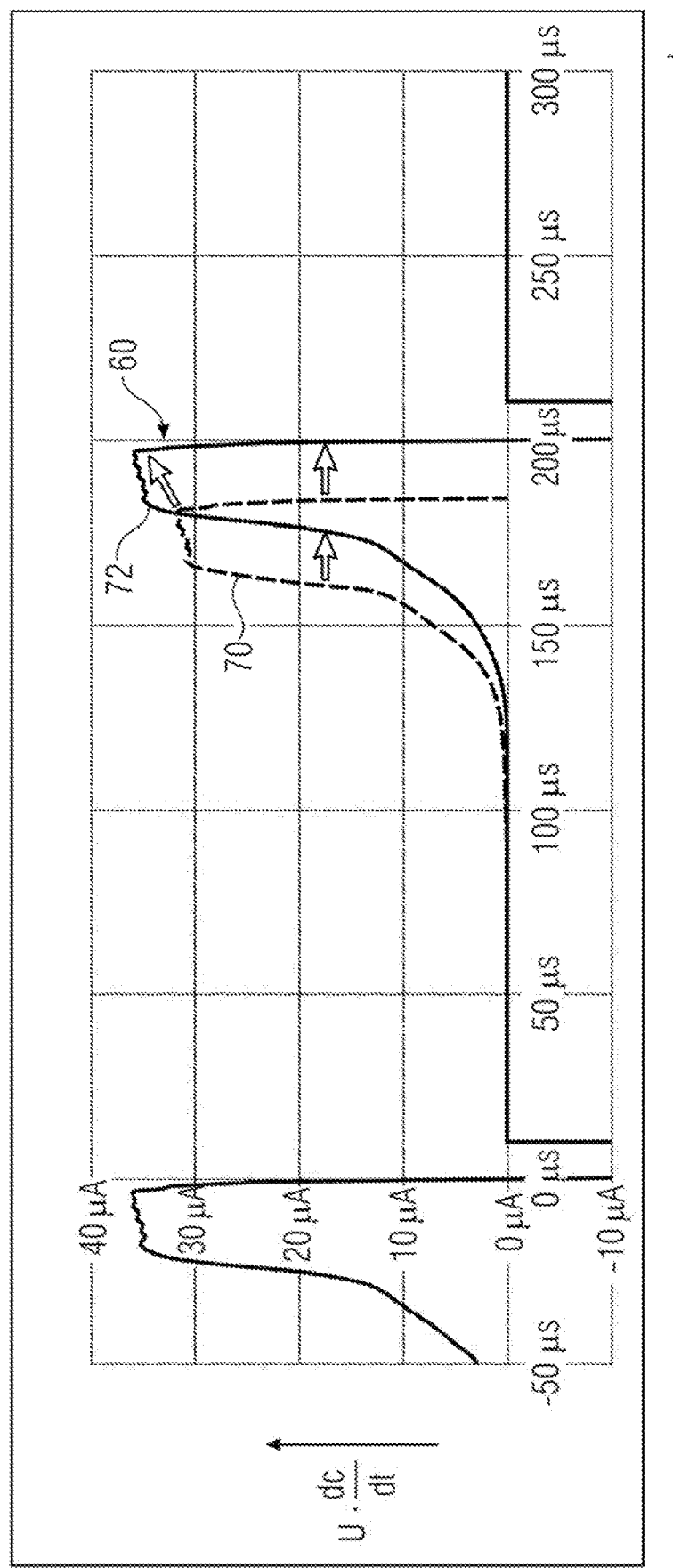

In examples, the second event can also be the actual zero crossing of the charging current, wherein the actual zero crossing is a more accurate indication of the zero crossing of the mirror, as is shown in FIG. 7. In this case, the predetermined event can be a point 66 that is easy to find on the rising edge of the pulse 60, for example exceedance of a predetermined threshold. The second event is then the actual zero crossing 68 of the charging current. In examples, the evaluation circuit can thus be designed to ascertain a pulse width between a first point in time 66, at which the signal exceeds the threshold, and a second point in time 68, at which the signal has a crossing through the reference position after the first point in time.

In examples, the position of the pulse can also be the determined event. The position can be derived as the mean value of the two points in time between which the pulse has exceeded the threshold. The mean value indicates the point in time at which the rotor moves from above into the upper layer if the electrodes comprise a plurality of layers arranged one above another. This is a very well-defined point in time and corresponds to a specific angle that is independent of ambient influences.

If a higher accuracy is desired and enough computing power is available, a more complex scheme can also be implemented. In one example, a model curve 70, see FIG. 8, can be fitted to the measured curve 72 corresponding to the pulse 60. The model curve can substantially be a curve that was measured by the manufacturer or in the laboratory. Since the shape of the curve varies only very little, it is sufficient to fit only three parameters, the temporal position, the width and the height of the curve, in order to fit the model curve 70 to the measured curve 72. The maximum inclination angle can be ascertained from the width. The advantage of such a method may include the fact that many measurements can contribute to the overall estimation of the width, which can greatly increase the accuracy. However, this also greatly increases the computing power. In examples, the evaluation circuit can thus be designed to ascertain the pulse width by fitting a model curve to the measured signal.

In examples, the circuit 30 can furthermore comprise a monitoring unit designed to detect a maximum value of the signal in order to check whether the maximum value lies within a predetermined range, and to output an error signal (also referred to as a malfunction signal) if the maximum value lies outside the predetermined range. Consequently, in examples, the maximum value, for example the maximum value 62 in FIG. 6, or the height of the model curve, can be used to monitor the intactness of the mirror. If this value remains within specific limits, proper operation of the mirror can be ensured. A value outside these limits indicates that the mirror is not oscillating as expected. In examples, the circuit 30 can be designed to output a warning, for example an acoustic or optical signal, if the maximum value does not lie within the specific limits.

In examples of the present disclosure, the evaluation circuit thus obtains time information from the detected charging current. The amplitude of the oscillation can be calculated from the time information and an ascertained period of the oscillation of the oscillatory body. In this case, the period of the oscillation of the oscillatory body can be ascertained from the zero crossings of the oscillation, e.g. the zero crossings of the charging current. By way of example, in FIGS. 6 to 8, the period of the oscillation is 200 μs. When ascertaining the period, it should be taken into consideration that the charging current becomes zero in each case when the actuation voltage is switched off.

Figure 24:
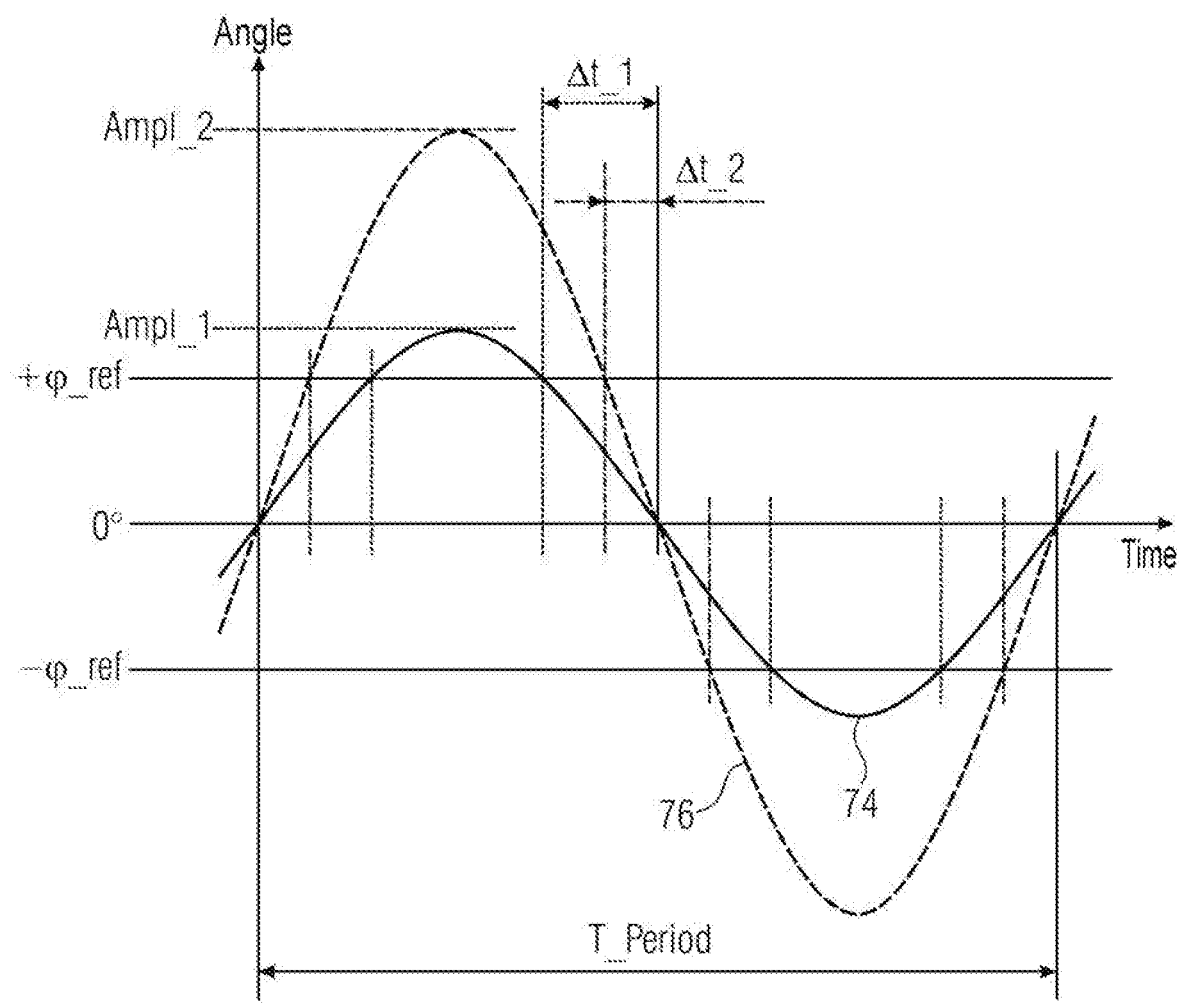
FIG. 24 shows a schematic illustration for elucidating one example of a calculation of an amplitude oscillation from the determined information and an ascertained period of the oscillation of the oscillatory body.

An explanation is given by way of example below, with reference to FIG. 24, of how the obtained time information and the oscillation duration are associated with the amplitude of the oscillation. FIG. 24 shows a first oscillation 74 having an amplitude Ampl_1 and a second oscillation 76 having an amplitude Ampl_2. The amplitude Ampl_2 is greater than the amplitude Ampl_1. The illustration in FIG. 24 reveals how the time from a reference angle φ_ref to the zero crossing Δt_1 and Δt_2, respectively, is dependent on the amplitude Ampl_1 and Ampl_2, respectively, and the period duration T_period. The greater the ratio of amplitude to reference angle Ampl/φ_ref, the smaller the ratio Δt/T_period. If the ratio Δt/T_period is regulated to a setpoint value, a setpoint amplitude can be attained as a result. The following holds true for sinusoidal oscillations:

$$\varphi\_ref = Ampl * \sin(2\pi * \Delta t/T\_period),$$

wherein a represents a full oscillation. The amplitude can thus be calculated from the time information Δt and the oscillation period. Furthermore, on the basis of the ascertained amplitude, it is possible to set a specific amplitude, having the setpoint value:

$$\Delta t/T\_period = 2\pi * a \, \sin(\varphi\_ref/Ampl).$$

In this case, A sin (x) represents the inverse sine function. In the linearizable range of the sine curve, if φ_ref<<Ampl, the following approximately holds true:

$$\Delta t/T\_period = 2\pi * \varphi\_ref/Ampl.$$

If the oscillation of the mirror is not exactly sinusoidal, then the setpoint value of the ratio Δt/T_period can be found using experiments or using mirror-specific trimming.

It is thus evident how the amplitude of the oscillatory body can be calculated or regulated on the basis of the detected time information and the period of the oscillation of the oscillatory body. In examples, a memory can be provided, such as e.g. in the circuit 30, corresponding relationships between time information, oscillation duration and oscillation amplitude being stored in the memory, which can be accessed in order to calculate the oscillation amplitude. In examples, the memory can alternatively or additionally contain corresponding relationships for drive parameters which make it possible to control or to regulate the oscillation amplitude to a target amplitude. For this purpose, by way of example, the absolute value of the actuation voltage or a phase offset between actuation voltage and oscillation of the oscillatory body can be set.

In order to ensure a smooth and symmetrical oscillation of the mirror, the comb drive is normally designed in such a way that it is symmetrical relative to the rotation axis. This means, however, that the total capacitance curve and hence the total charging current are likewise symmetrical and it is not possible to detect in what direction the mirror points. In other words, it is possible to detect the inclination angle, but not its sign, if the comb drive is symmetrical relative to the oscillation axis.

If the charging currents of the left side and of the right side, relative to the oscillation axis, of the comb drive are measured independently, a specific asymmetry can be observed, while the sum of the two charging currents is symmetrical. This asymmetry can originate from the fact that the oscillation axis is not arranged strictly at the center of gravity of the comb drive. Its position is greatly influenced by the mirror and the mirror movement.

Examples of the present disclosure make use of this fact in order to detect a direction in which an oscillatory body moves during an oscillation about an oscillation axis.

Figure 9:
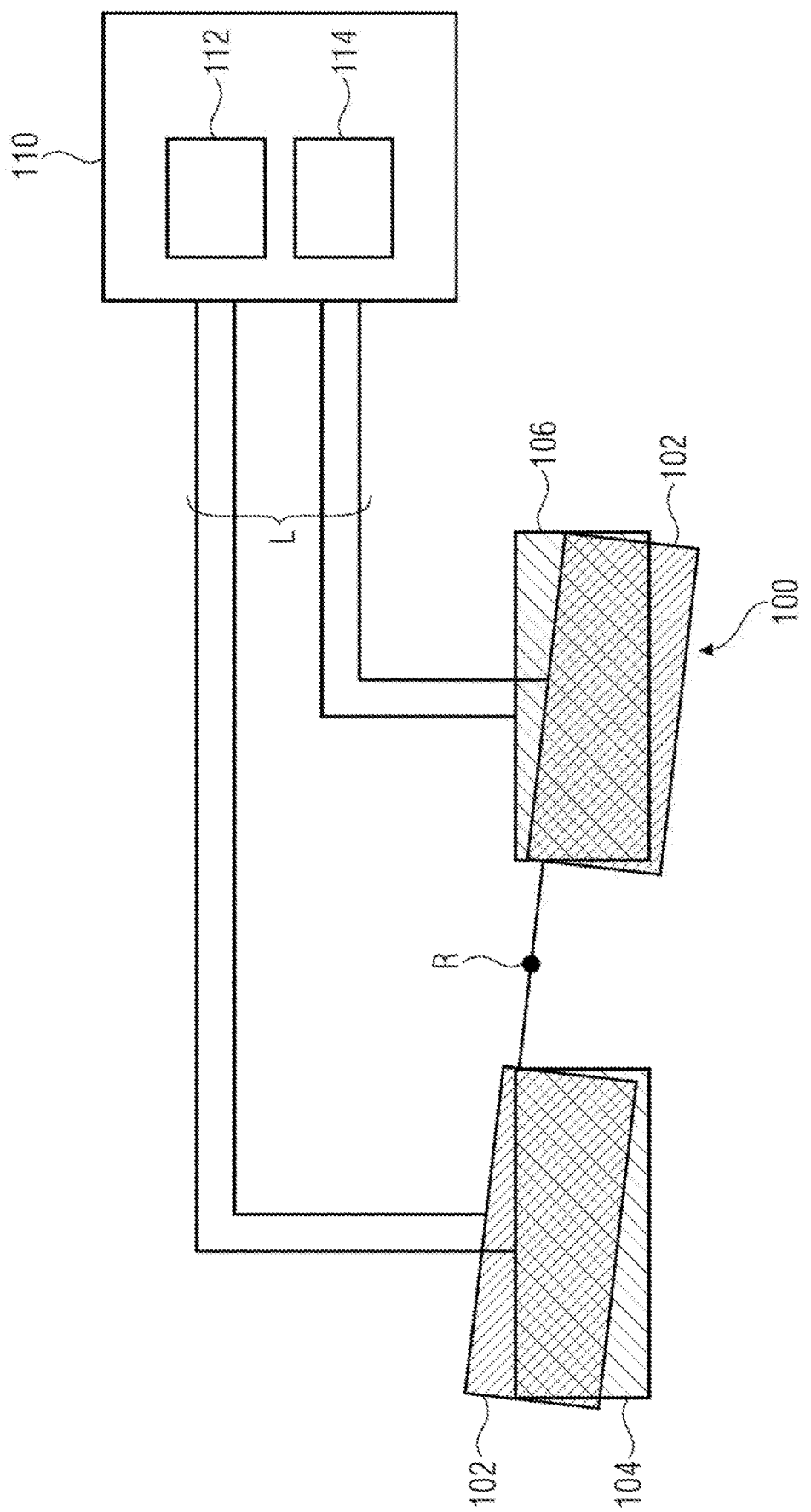
FIG. 9 shows a schematic illustration of one example of a device for detecting a direction in which an oscillatory body moves during an oscillation about an oscillation axis.

FIG. 9 schematically shows an oscillatory body 100 which oscillates about an oscillation axis R. Movable electrodes 102 of the oscillatory body are illustrated schematically. Furthermore, FIG. 9 schematically illustrates a first stationary electrode 104, which is arranged on a first side of the oscillation axis R, and a second stationary electrode 106, which is arranged on a second side of the oscillation axis. An oscillation of the oscillatory body 100 results in a first change in a capacitance between the movable electrode 102 and the first stationary electrode 104 and a second change in capacitance between the movable electrode 102 and the second stationary electrode 106. In this case, the movable electrode 102 can comprise a single electrode or a plurality of separate electrodes. The movable electrode 102 and the stationary electrodes 106 are electrically connected to a circuit 110 via lines L illustrated schematically in FIG. 9. The circuit 110 comprises a detection circuit 112 and an evaluation circuit 114. The detection circuit 112 is designed to detect a first signal representing a measure of the first change in capacitance over time before a crossing through a reference position of the oscillation, and a second signal representing a measure of the second change in capacitance over time before the crossing through the reference position of the oscillation. In examples, the respective charging current is detected for this purpose. The evaluation circuit 114 is designed to determine a direction in which the oscillatory body moves during the oscillation before the crossing through the reference position of the oscillation, using the detected first and second signals.

In examples, a movable electrode and a stationary electrode, between which the charging current is measured, respectively form an electrode pair. The charging currents of electrode pairs are measured independently of one another. In examples, the movable electrodes can be electrically connected to one another, while the stationary electrodes are electrically insulated from one another. In examples, the stationary electrodes can be electrically connected and the movable electrodes can be electrically insulated from one another. In the first case, one electrical connection to the oscillatory body is sufficient, which simplifies the construction.

Figure 10:
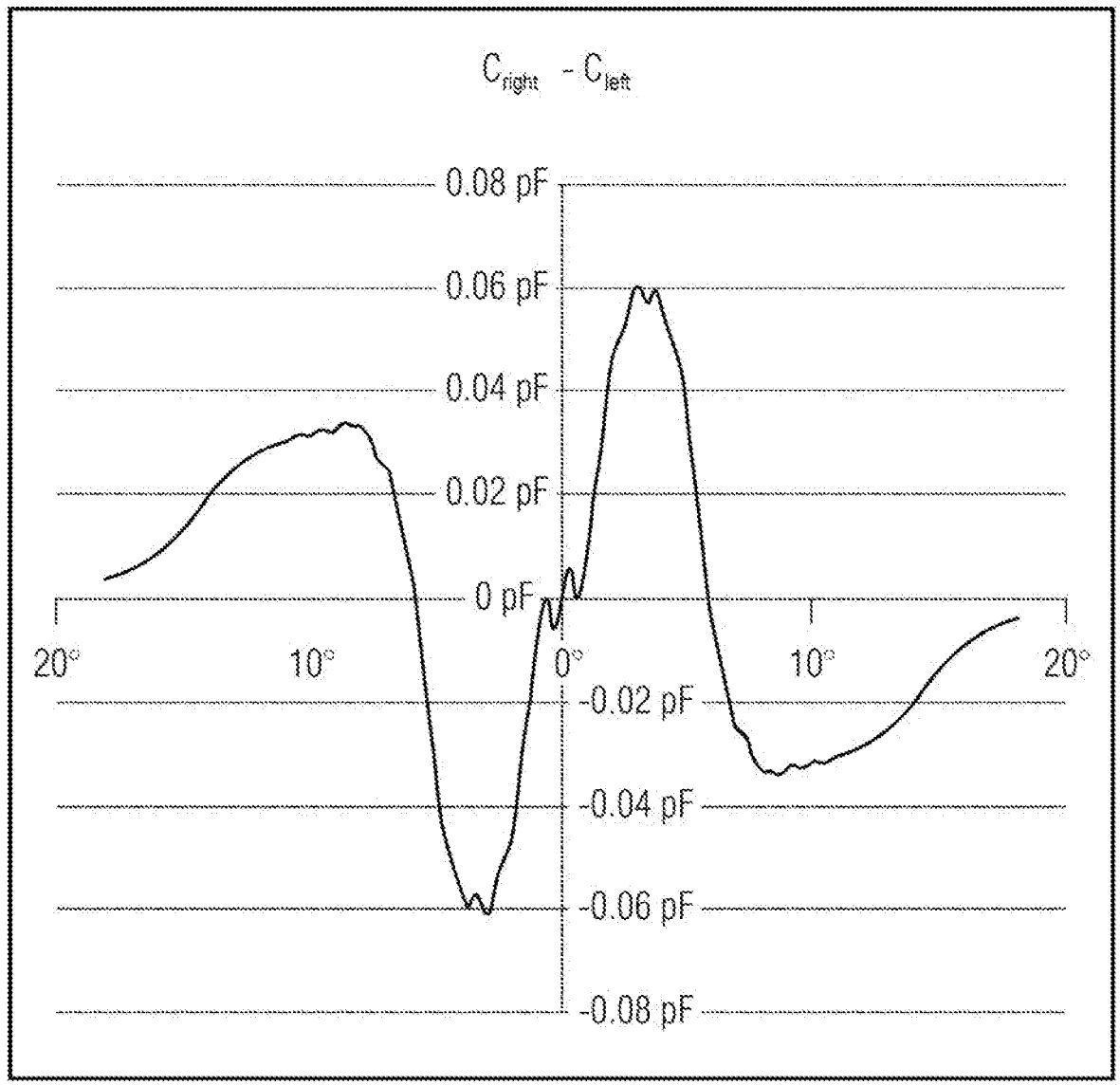
FIG. 10 shows a diagram showing a difference between capacitances on two different sides of an oscillation axis.

As has been explained above, if the charging currents of the left side and the right side of the comb drive are measured independently, a specific asymmetry can be observed. FIG. 10 shows a diagram showing the difference in capacitance between stationary electrode 106 and movable electrode 102 on the right side minus the capacitance between the movable electrode 102 and the stationary electrode 104 on the left side. FIG. 10 thus shows an asymmetry of the difference in capacitance versus the oscillation angle. This asymmetry can be used to detect the direction of the mirror by calculating the difference between the charging currents of the left side and the right side.

In this case, an asymmetry should be understood to mean, in particular, an asymmetry relative to the rotation axis in the direction perpendicular to the mirror surface in the rest position, e.g. in the z-direction in FIGS. 1 and 3. An asymmetry which has the consequence that the oscillation axis is not at the center of gravity of the comb drive can be achieved, for example, by virtue of the comb drive of the rotor and the comb drive of the stator (and thus the electrodes thereof) having different thicknesses (in the z-direction). In other examples, an asymmetry can be achieved by the comb drive of the rotor and the comb drive of the stator being offset with respect to one another in the z-direction, as is shown in FIG. 2, for example. In other examples, an asymmetry can be achieved using a comb drive system which is multilayered in the thickness direction. In examples, layers of the comb drive system that are arranged above and below an oscillation axis in the thickness direction can have different thicknesses. In examples, layers of a multilayered comb drive system can be arranged in a manner offset vertically relative to an oscillation axis.

Figure 11:
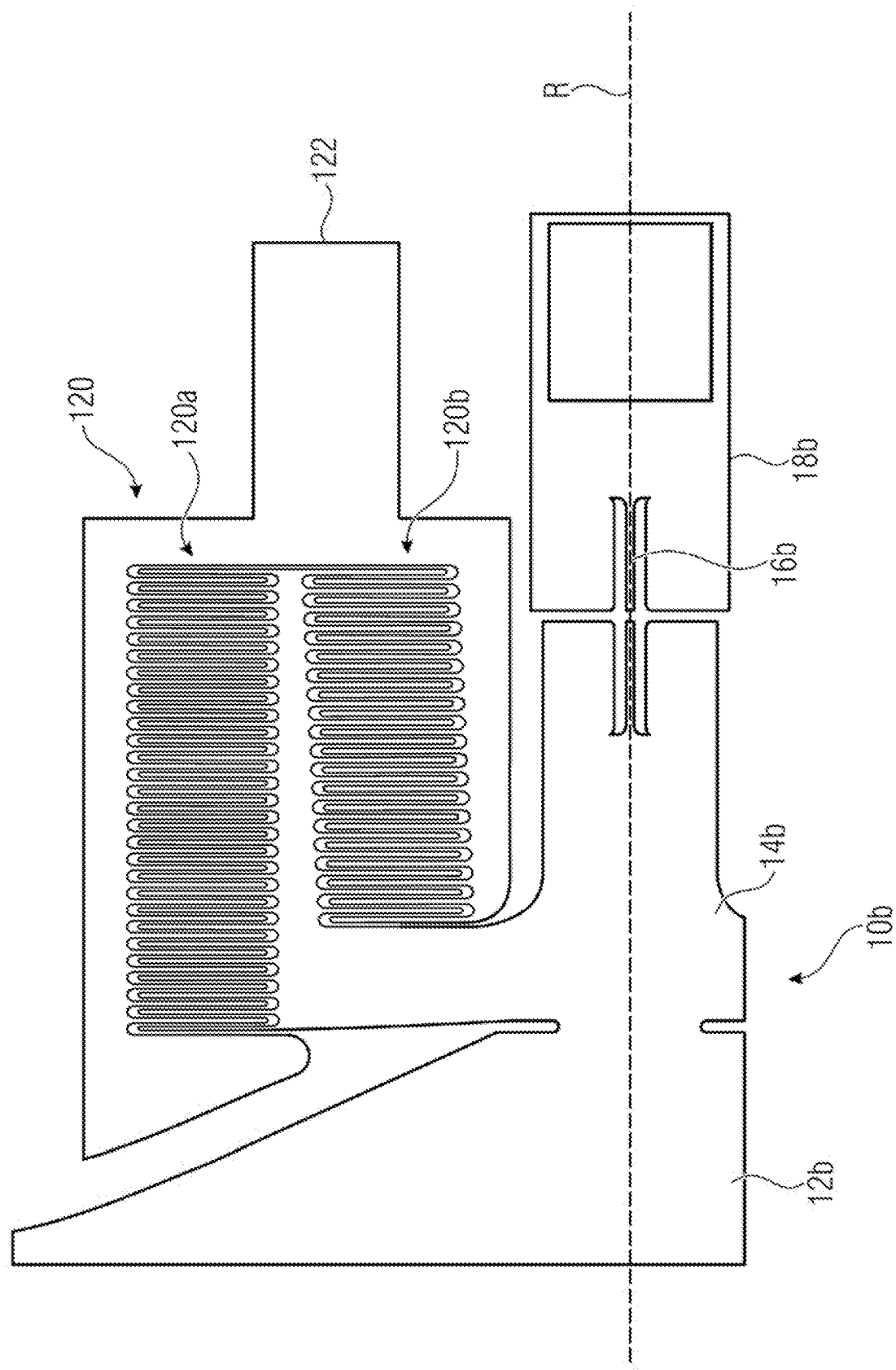
FIG. 11 shows a schematic plan view of an excerpt from one example of an oscillatory body.

FIG. 11 schematically shows a part of a comb drive system of a mirror 12b. Only a right side of the mirror 12b is illustrated in FIG. 11. The mirror 12b is mounted such that it can oscillate on a carrier frame 18b at both ends of the mirror by way of respective torsion beams 16b. As is shown in FIG. 11, the comb drive 120 comprises in each case two rotor comb electrodes and stator comb electrodes. In other words, the comb drive comprises two series of rotor finger electrodes and stator finger electrodes. The rotor comb electrodes are secured to a carrier beam 14b of the oscillatory body 10b and the stator comb electrodes are secured to a stator 122. The stator 122 can be part of the carrier frame 18b.

FIG. 11 shows only an excerpt from a corresponding MEMS mirror structure. Corresponding comb drives are arranged symmetrically at both ends of the mirror in the direction of the oscillation axis R and on both sides of the oscillation axis R, such that a total of four corresponding comb drives can be provided.

Figure 13:
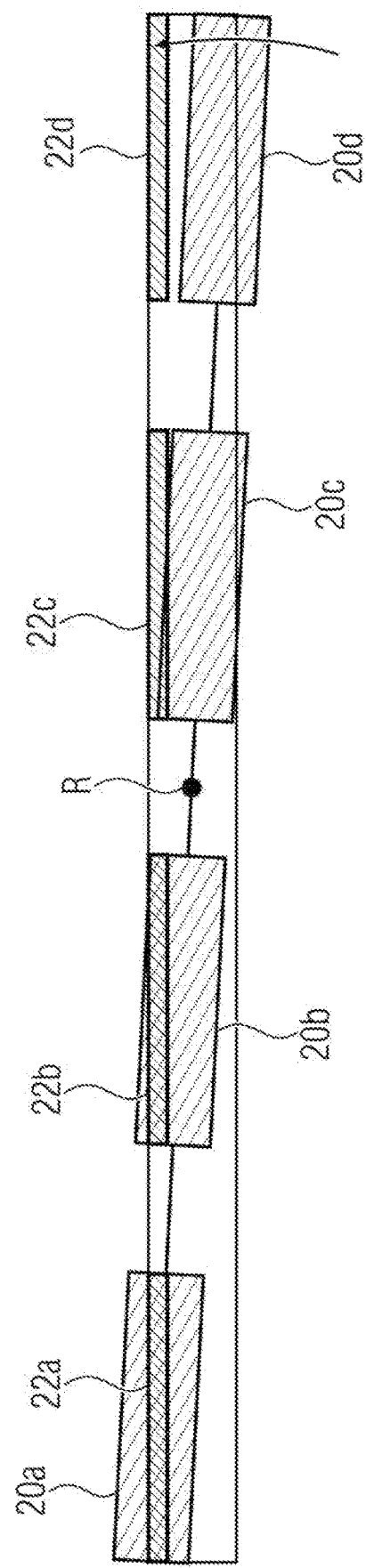
FIG. 13 shows a schematic illustration for elucidating an oscillation of an oscillatory body in a second direction.

FIGS. 12A, 12B and 13 show schematic cross-sectional views of comb electrodes of the oscillatory body and comb electrodes of the stator. FIGS. 12A, 12B and 13 here in each case show a schematic cross-sectional view through the comb drives on one side of the mirror 12b. Two comb electrodes 20a and 20b of the rotor or oscillatory body 10b are arranged on the left side of the oscillation axis R, and two comb electrodes 20c and 20d of the oscillatory body 10b are arranged on the right side of the rotation axis R. In the same way, two stator comb electrodes 22a and 22b are arranged on the left side of the oscillation axis R, and two stator comb electrodes 22c and 22d are arranged on the right side of the oscillation axis R. As can be discerned, the rotor comb electrodes 20a to 20d have a larger thickness than the stator comb electrodes 22a to 22d. Consequently, an asymmetry arises and the rotation axis is not at the center of gravity (centroid) of the comb drive. In FIG. 12A, the oscillatory body is arranged at an oscillation angle of 9.5° and moves in the direction toward its rest position, as is indicated by the arrow. In FIG. 12B, the oscillatory body is arranged at an angle of 6° and likewise moves from above toward its rest position. In FIG. 13, the oscillatory body moves from below toward its rest position, e.g. the oscillation direction in FIG. 13 is opposite to the oscillation direction in FIGS. 12A and 12B.

Figure 14:
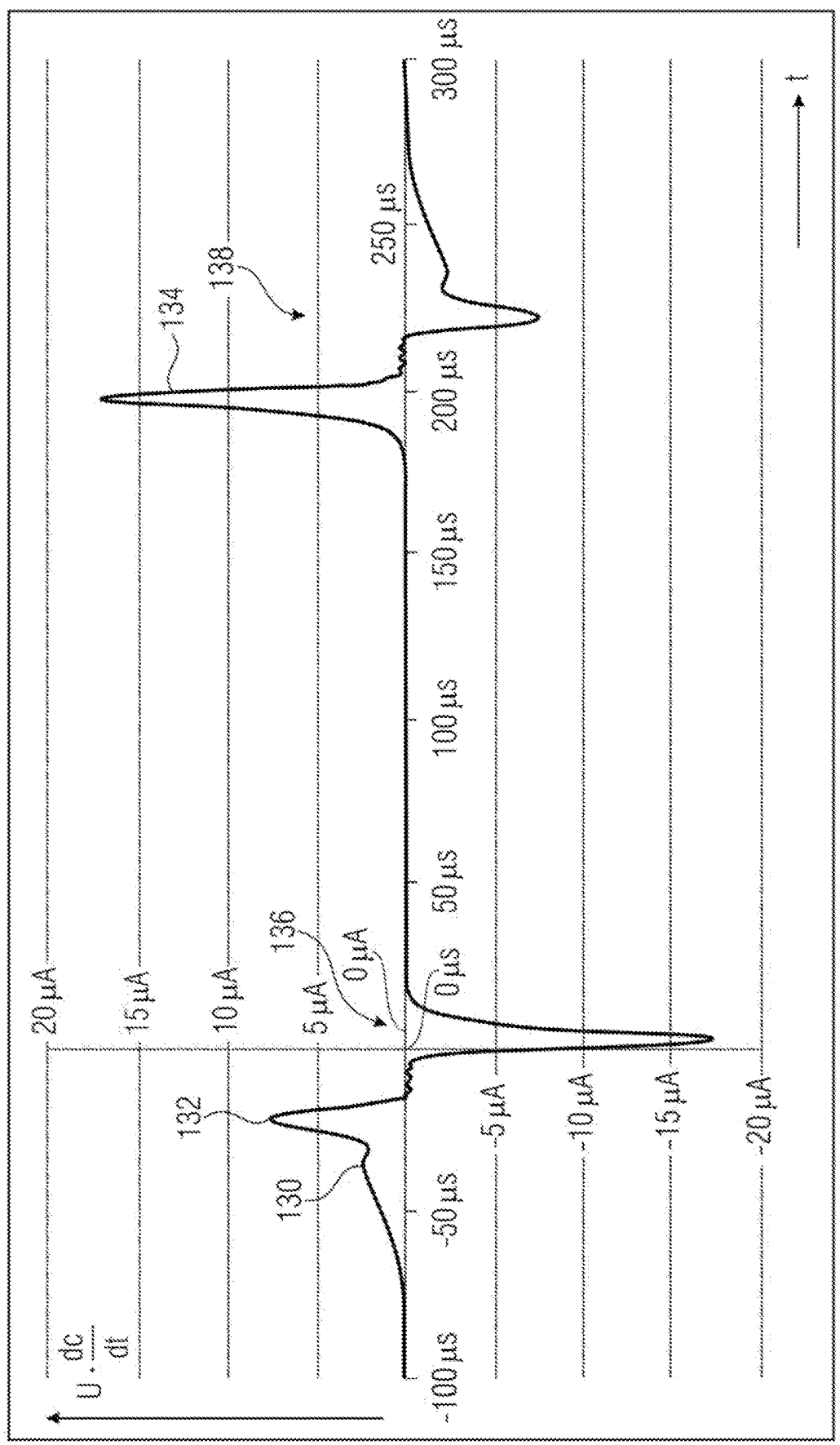
FIG. 14 shows a diagram illustrating a change in capacitance over time, the change in capacitance being obtained in the case of one example of an oscillatory body.

Changes in capacitance between the respective comb electrodes on the right side of the oscillation axis and the left side of the oscillation axis are detected separately. FIG. 14 shows the change in capacitance, derivative over time, for the comb electrodes 20c, 20d, 22c, 22d on the right side of the oscillation axis R. The change in capacitance can be ascertained for example by measuring the charging current. As can be discerned in FIG. 14, the change in capacitance has two peaks 130 and 132. The wide lower peak 130 originates from the change in capacitance that occurs as a result of the intermeshing of the first series, e.g. of the comb electrodes 20c and 22c, at an angle of 9.5°. The second, narrower and higher peak 132 originates from the change in capacitance that occurs when the second series of comb electrodes, e.g. the comb electrodes 20d and 22d, intermesh at 6°. This second sharp peak 132 is simple to detect, occurs at the same angle and is independent of temperature, pressure and moisture. In examples of the present disclosure, this peak can be used as the predetermined event in the signal in order to ascertain the amplitude of the oscillation.

The changes in capacitance around the point in time of 0 µs in FIG. 14 thus represent the profile that occurs when the oscillatory body oscillates in the direction shown in FIGS. 12A and 12B, that is to say from top to bottom. If the oscillatory body oscillates back from bottom to top, then the change in capacitance before an oscillation zero crossing has a pulse 134. The pulse 134 represents a high peak brought about by the change in capacitance of both comb electrode pairs, since a change in capacitance occurs simultaneously in the case of both comb electrode pairs. This effect occurs, in particular, because the oscillation axis R is offset downward relative to the stator comb electrodes. Consequently, the changes in capacitance, for different directions in which the oscillatory body oscillates, exhibit different profiles, a profile 136 for a first oscillation direction (from top to bottom) and a profile 138 for a second oscillation direction (from bottom to top).

Figure 15:
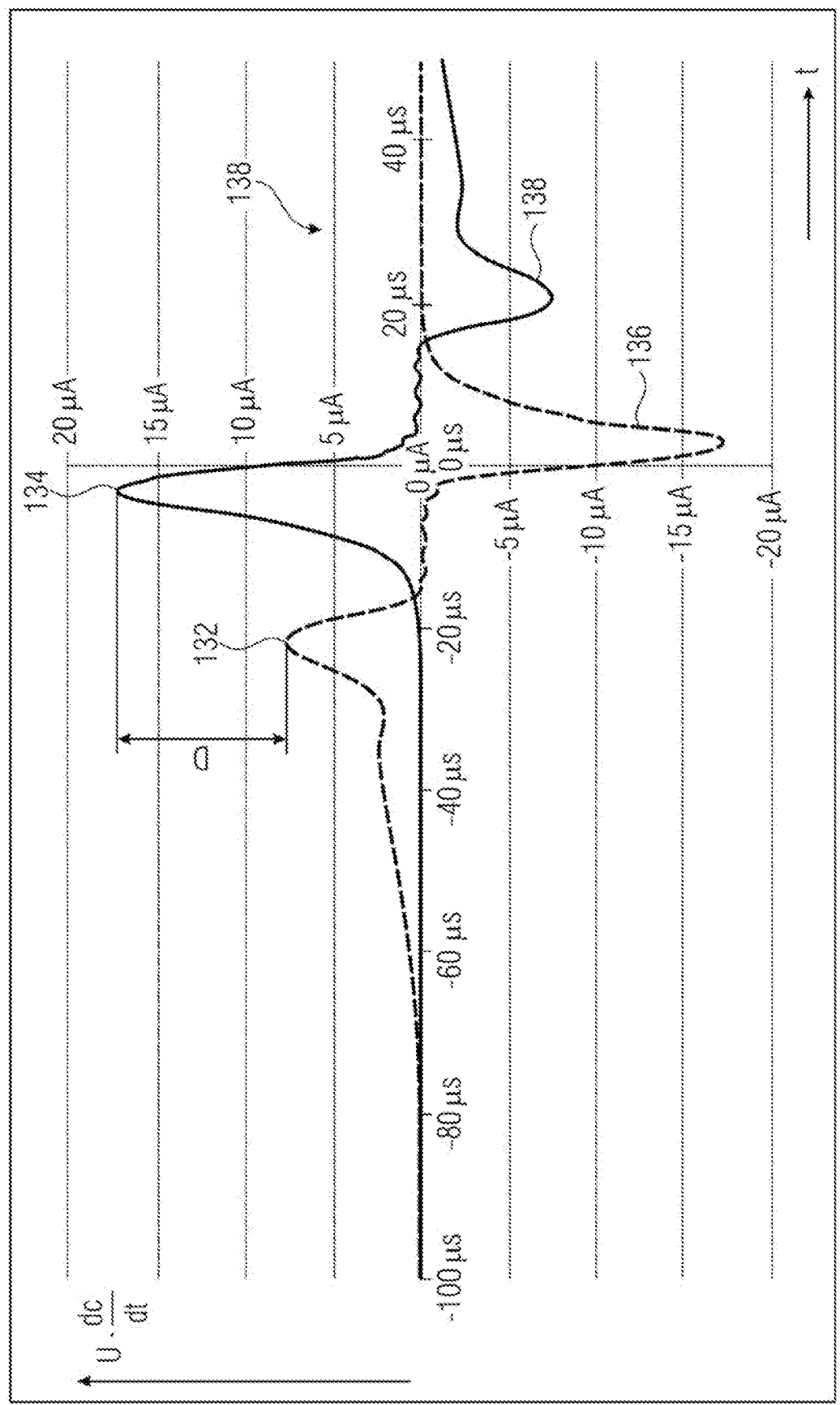
FIG. 15 shows diagrams showing changes in capacitance over time between movable electrode and stationary electrode on different sides of the oscillation axis.

Since corresponding comb electrodes are arranged on both sides of the oscillation axis, which are axially symmetrical with respect to the oscillation axis in the rest position of the oscillatory body, the change in capacitance profile 138 also corresponds to a change in capacitance profile of the comb electrodes arranged on the left side of the oscillation axis when the oscillatory body moves in the clockwise direction. FIG. 15 correspondingly shows the change in capacitance profile 136 of the comb electrode pairs on the right side and the change in capacitance profile 138 of the comb electrode pairs on the left side when the oscillatory body moves through its rest position in the clockwise direction. As can be discerned from FIG. 15, this results in a large difference D between the maxima of the pulses generated before the zero crossing by the comb electrodes arranged on the different sides of the oscillation axis. The oscillation direction can thus be ascertained by calculating the difference D. If the difference D between the pulses has a first sign, then the oscillatory body moves in a first direction, while if the difference has an opposite sign, the oscillatory body moves in a second direction. In the example shown in FIG. 15, the movement takes place in the clockwise direction if the difference between the maximum 134 generated by the left side and the maximum 132 generated by the right side is positive, while a movement takes place in the counterclockwise direction if the difference is negative.

In examples, the evaluation circuit 114 is thus designed to compare a maximum value of the first signal before the crossing through the reference position with a maximum value of the second signal before the crossing through the reference position and to determine the direction depending on which maximum value is higher.

In examples, the evaluation circuit can be designed to carry out a two-part detection, namely firstly a detection of the direction of movement of the oscillatory body and secondly a detection of the amplitude of the oscillations of the oscillatory body. In order to detect the direction of movement, it is possible to detect the maximum value in each charging current, e.g. the left side and the right side separately. This can be done using standard peak detectors. At the zero crossing, these values are compared. In this case, the zero crossing represents the crossing of the oscillatory body through the rest position thereof. If the maximum value of the left side is lower than that of the right side, the oscillatory body is currently oscillating from left to right. If the maximum of the left side is higher than the maximum of the right side, then the oscillatory body is oscillating in the opposite direction. In order to detect the amplitude of the oscillations, a threshold can be derived from the smaller of the two maximum values, for example at three quarters of the smaller maximum value. It is then possible to detect points in time at which the peaks exceed the threshold. In this regard, it should be noted that the height of the peaks does not fluctuate greatly from one cycle to the next cycle, and so it is allowed to estimate the threshold in one cycle and to use it in the next cycle. The position of the lower peak can be derived using the average of the two points in time between which the peak has exceeded the threshold. The mean value indicates the point in time at which the rotor moves from above into the upper layer. This is a very well-defined point in time and corresponds to a specific angle that is independent of ambient influences.

The previous examples were directed to systems in which the comb drives comprise a conductive layer. The principle of detecting events in the capacitances and using asymmetries in order to determine the alignment and, in particular, the direction of movement of the mirror can be used with even greater effect if the comb drive includes more than one layer and, in particular, if one layer is thinner than the other layers. Consideration is given hereinafter to a comb drive that includes a first conductive layer separated from a second conductive layer by a thin insulation layer. The first conductive layer has a first thickness, which is smaller than a second thickness of the second conductive layer. However, there is no need to mention separately that the present disclosure can readily also be applied to a greater number of conductive layers.

FIG. 16A shows schematically in each case an oscillatory body 100 in different positions, which oscillatory body oscillates about a rotation axis R relative to stator comb electrodes of a first layer 150. FIG. 16B shows illustrations of the oscillatory body 100 oscillating about the rotation axis R in various positions, which oscillatory body oscillates relative to stator comb electrodes of a second layer 152. As is illustrated, the second layer 152 is thicker than the first layer 150.

FIGS. 17A and 17B show simplified curves not true to scale of the capacitance profiles for a thin first layer 150 and a thick second layer 152 for the left side and the right side for a comb drive having only one series of fingers on each side of the oscillation axis.

FIG. 17A shows in each case the capacitances between the rotor comb electrode and the stator comb electrodes of the first layer 150 and of the second layer 152 on the left side of the oscillation axis. In this case, the capacitance $C_{var\_1\_1}(\varphi)$ shows the capacitance between the rotor comb electrode and the stator comb electrode of the first layer 150 and the capacitance $C_{var\_1\_2}(\varphi)$ shows the capacitance between the rotor comb electrode and the stator comb electrode 152 of the second layer.

FIG. 17B shows the capacitances between the rotor comb electrode and the respective stator comb electrode of the first and second layers, 150 and 152, on the right side of the oscillation axis. In this case, $C_{var\_r\_1}(\varphi)$ shows the capacitance between the rotor comb electrode and the stator comb electrode of the first layer 150, and $C_{var\_r\_2}(\varphi)$ shows the capacitance between the rotor comb electrode and the stator comb electrode of the second layer 152.

As can be discerned from FIGS. 17A and 17B, the curves for the first layer and the second layer differ significantly. Furthermore, the curves differ significantly from the total capacitance. It should be noted that the curves exhibit specific regions in which the capacitance does not change. This means that the derivative in these regions is zero. The thinner the layer, the larger the regions. Simultaneously therewith, the region in which the capacitance increases becomes shorter. The thinner the layer, the faster the capacitance reaches its maximum. This means that the derivative of the capacitance turns into short and well-defined pulses or peaks. In this regard, reference may be made to the above description of FIG. 14, for example.

Figure 18:
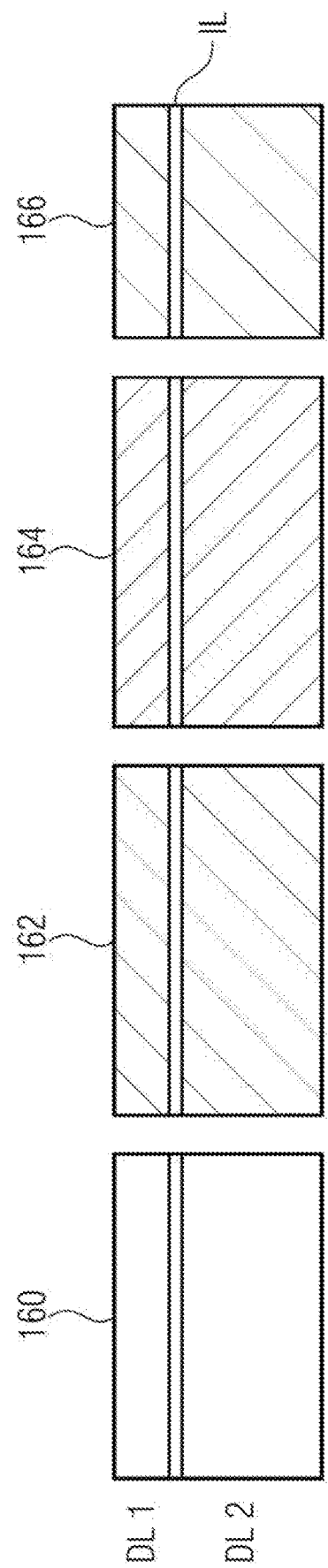
FIG. 18 shows a schematic cross-sectional view of one example of a multilayered system.
Figure 19:
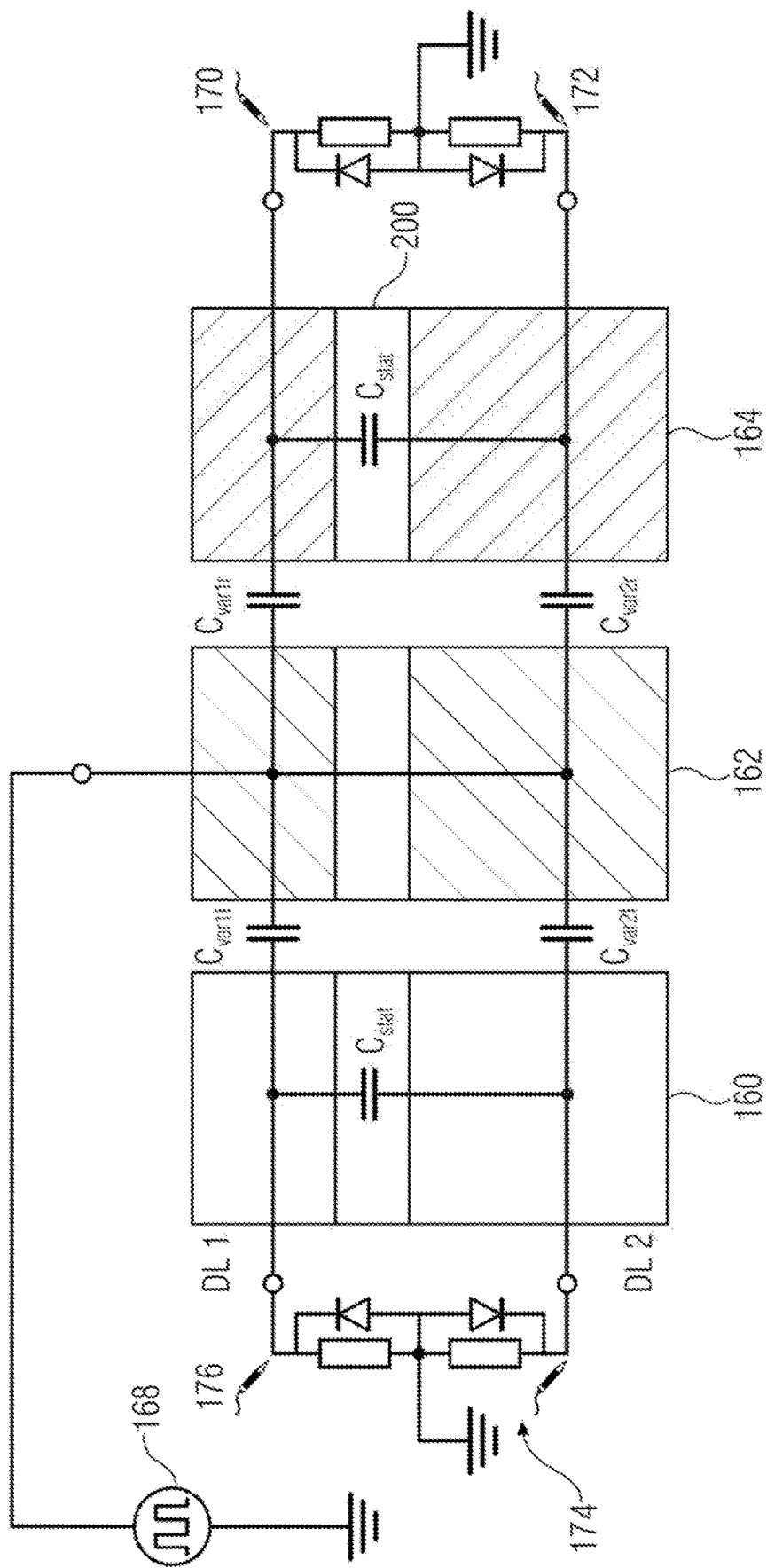
FIG. 19 shows a schematic illustration for elucidating the detection of a measure of the change in capacitance in the case of one example.

FIGS. 18 and 19 show highly schematically illustrations for elucidating a multilayered drive system that simultaneously also serves as a detection system. The system comprises two conductive layers DL1 and DL2 separated by a thin insulating layer IL. The layer DL1 is thinner than the layer DL2. FIG. 18 shows a cross section through a drive system in the direction of an external rotation axis. A left stator 160, a rotor 162 and a right stator 164 and also a frame 166 are illustrated schematically. The left stator 160, the rotor 162 and the right stator 164 comprise respective comb electrodes between which capacitances are formed.

FIG. 19 schematically shows a circuit arrangement for drive and for detection using a corresponding multilayered structure. As is shown in FIG. 19, the first layer and the second layer DL1 and DL2 of the rotor 162 are connected, such that they can be regarded as one electrode. A drive voltage in the form of a rectangular voltage is applied to the rotor electrode by way of a voltage source 168. A static capacitance $C_{stat}$ is in each case present between the first layer DL1 and the second layer DL2 of the left and right stators, 160 and 164. Between the first layer DL1 of the rotor 162 and the first layer DL1 of the left stator 160 there exists a variable capacitance $C_{var1l}$. Between the second layer DL2 of the rotor 162 and the second layer DL2 of the left stator 160 there exists a second variable capacitance $C_{var2l}$. Between the first layer DL1 of the rotor 162 and the first layer DL1 of the right stator 164 there exists a variable capacitance $C_{var1r}$, and between the second layer DL2 of the rotor 162 and the second layer DL2 of the right stator 164 there exists a variable capacitance $C_{var2r}$. Ammeters for detecting charging currents of the variable capacitances mentioned are indicated schematically at 170, 172, 174 and 176 in FIG. 19.

Figure 20:
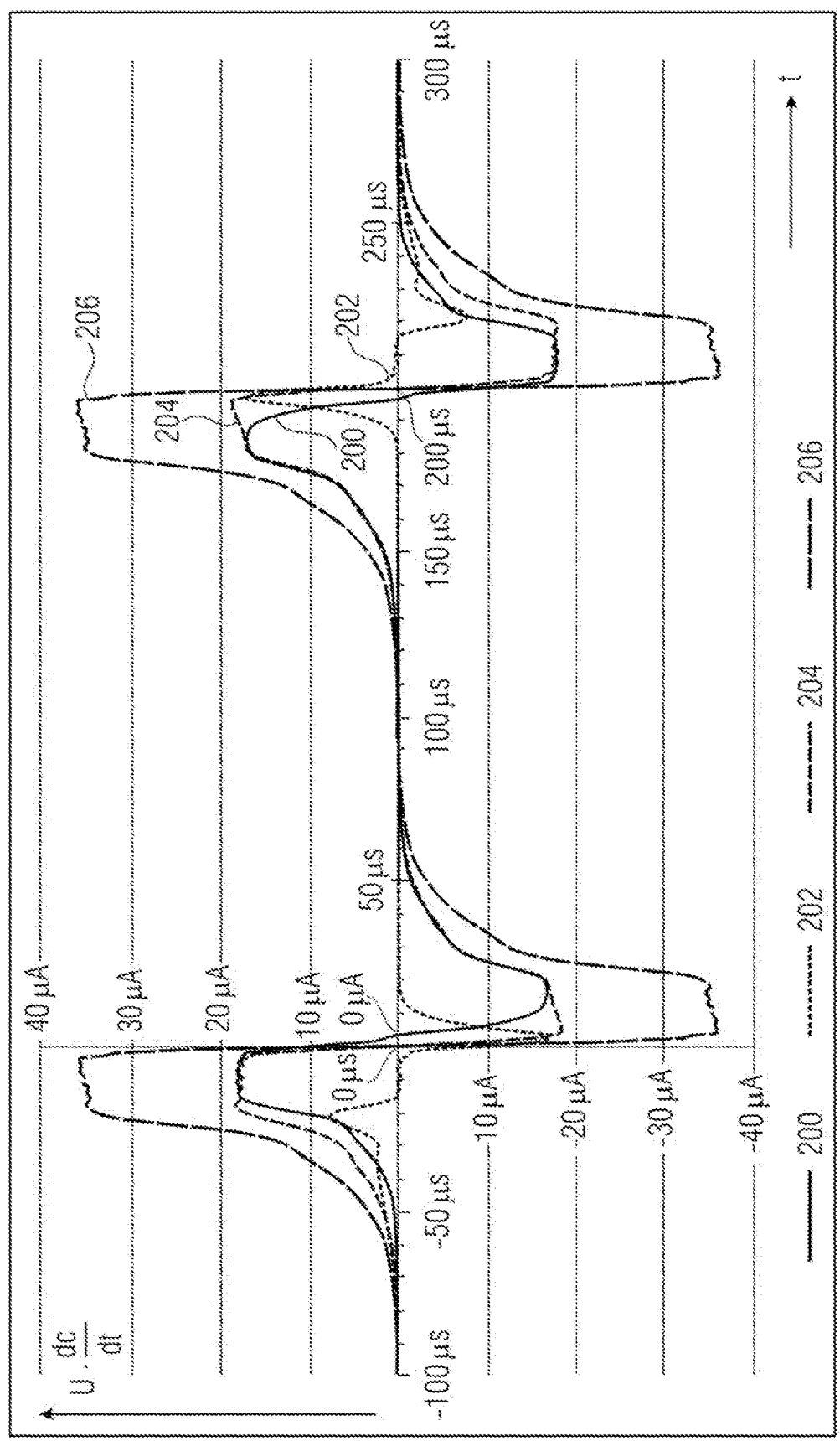
FIG. 20 shows schematic diagrams of changes in capacitance of different layers of the example shown in FIG. 19.

FIG. 20 shows the derivative of capacitances over time, which were obtained during a simulation using the layer structure shown in FIGS. 18 and 19. It should be noted here that the capacitance derivatives shown are hypothetical to the effect that the permanent application of a constant voltage is assumed. In this case, a curve 200 shows the derivative of the capacitance $C_{var2r}$ with respect to time. A curve 202 shows the derivative of the capacitance $C_{var1r}$ with respect to time. A curve 204 shows a sum of the derivatives of the capacitances $C_{var1r}$ and $C_{var2r}$ with respect to time, e.g. the sum of the derivatives of the capacitances on the right side of the oscillation axis with respect to time. A curve 206 shows the sum of all four variable capacitances with respect to time, namely $C_{var1r}$, $C_{var2r}$, $C_{var1l}$ and $C_{var2l}$. As can be gathered from FIG. 20, the sum of the derivatives of all capacitances is substantially symmetrical, while the individual derivatives and the sums of the derivatives are asymmetrical from one side. The separate detection of changes in capacitance on both sides thus makes it possible to detect the direction of movement. The sum of the derivatives of all capacitances can be used to determine the amplitude of the oscillation.

Generally, in examples of the present disclosure, detected currents representing the changes in capacitance can be summed in order to implement the monitoring strategies discussed above. Generally, the zero crossing in the case of a plurality of layers can be ascertained on the basis of all detected currents.

Figure 21:
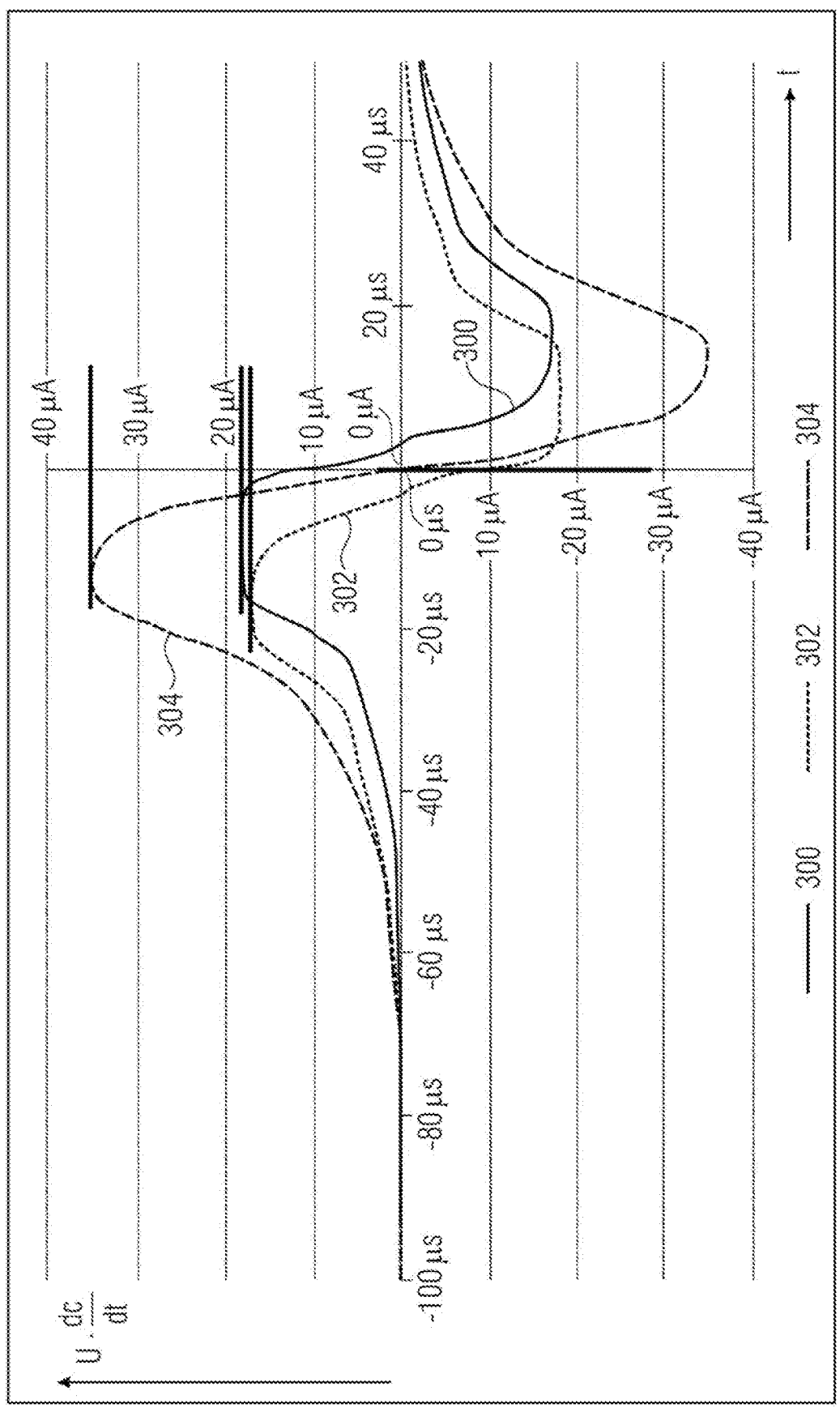
FIG. 21 shows schematic diagrams of changes in capacitance of layers of the example shown in FIG. 20.

FIG. 21 shows curves of the detected currents between the second layer DL2 of the rotor 162 and the left and right stators, 160 and 164. In this case, a curve 300 shows the derivative of the capacitance $C_{var2r}$ over time, a curve 302 shows the derivative of the capacitance $C_{var2l}$ over time, and the curve 304 shows a sum of the two derivatives. The respective amplitudes are a function of the mirror speed, the actuation voltage and the mirror design. The zero crossing of the sum of the two currents of the layer DL2 indicates the zero crossing of the mirror. In the case of multilayered systems, the sum of the charging currents of one layer or the sum of the charging currents of all of the layers can indicate the zero crossing of the oscillation.

Figure 22:
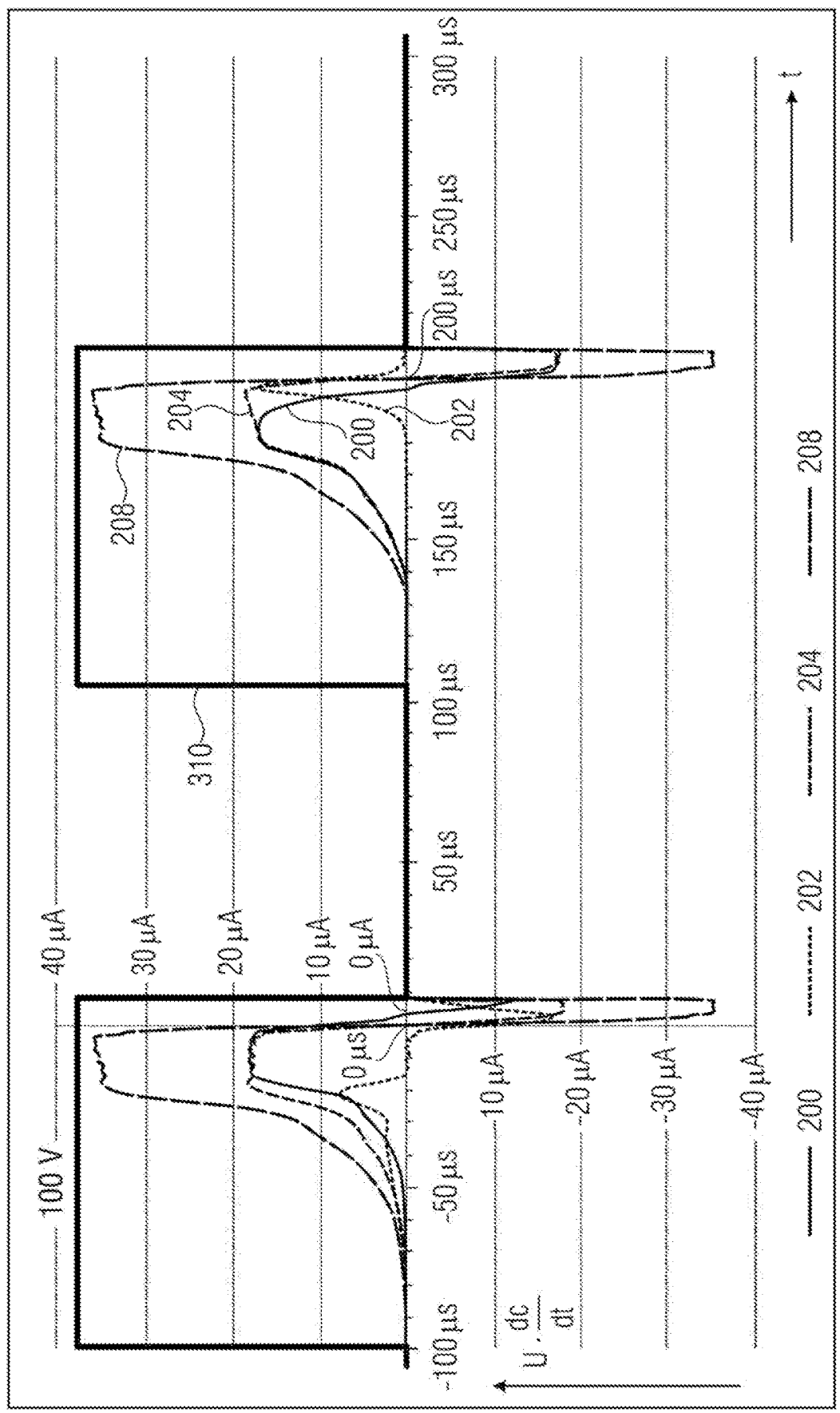
FIG. 22 shows schematic diagrams of changes in capacitance and a drive signal.
Figure 23:
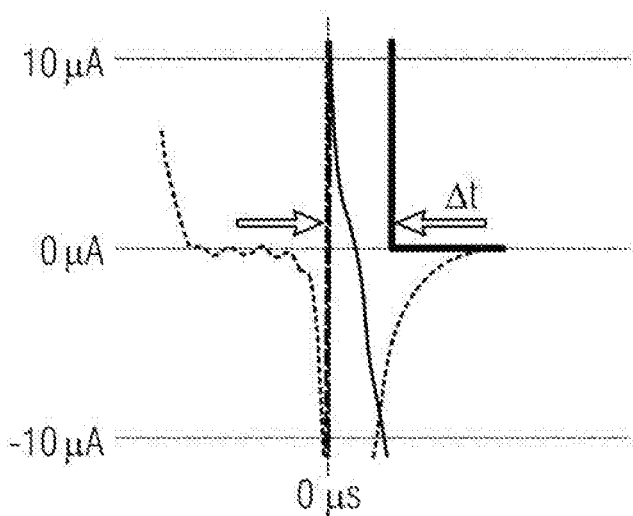
FIG. 23 shows a schematic illustration for elucidating a phase offset.

FIG. 22 shows the curves from FIG. 20 for the case where an actuation voltage 310 of 100 volts, for example, is applied periodically. As soon as the actuation voltage goes to zero, all charging currents fall to zero. Generally, the actuation voltage can be applied with an offset relative to the oscillation of the oscillatory body, such that the actuation lags slightly behind the oscillation. This can be discerned from the fact that the actuation voltage goes to zero only after the zero crossing of the oscillation, which zero crossing is indicated for example by the zero crossing of the sum of all currents. In this regard, FIG. 23 shows for example a time offset of $\Delta t$ between the zero crossing of the oscillation and the turn-off of the actuation voltage. As a result of this temporal offset, active damping of the oscillation can be effected in order to regulate the amplitude. In the time period between the zero crossing of the oscillation and the switch-off of the actuation voltage, active damping of the oscillation takes place since the electrostatic forces brought about by the applied voltage counteract the oscillation.

In examples, the circuit 30 enables the amplitude to be regulated as follows. The four charging currents via the variable capacitances shown in FIG. 19 can be detected for example by the voltage across four detection resistors, see FIG. 19, being measured while the actuation is active. The measured voltages of at least the second layer DL2 or of both layers are added in order to detect the zero crossing. The peak voltages of the first layer DL1, e.g. of the thinner layer, can be subtracted from one another in order to detect the direction of movement. The actuation can be turned off after the zero crossing with a variable delay $\Delta t$. The delay time can be used to regulate the amplitude using active damping. When the actuation voltage is turned off, a voltage spike may be observed, which can be capped by the diodes in the example shown. The actuation voltage is then switched on again when the mirror is in its fully deflected position.

Examples of the present disclosure thus provide a MEMS device comprising an oscillatory body capable of oscillation about an oscillation axis, a device for detecting an amplitude of an oscillation of the oscillatory body and a driver device designed to drive the oscillatory body, wherein the driver device comprises the electrode of the oscillatory body, the stationary electrode and a driver circuit designed to apply a variable voltage between the electrode of the oscillatory body and the stationary electrode. The MEMS device can furthermore comprise a regulating circuit designed to regulate the voltage applied between the electrode of the oscillatory body and the stationary electrode using the information. In particular, the regulating circuit can be designed to regulate a phase difference between the voltage applied between the electrode of the oscillatory body and the stationary electrode and the oscillation of the oscillatory body.

In examples, the devices or circuits can comprise memories or registers in which target points in time for the determined events, for example the peaks and/or edges, can be stored. In examples, the detected points in time can then be regulated to the target points in time, such that a desired oscillation amplitude can be set.

Examples of the present disclosure can be used in LiDAR systems, in particular. Examples are based on the concept of using specific properties of the derivative of the drive capacitances in order to determine or to regulate the oscillation amplitude of an oscillatory body, in particular of a MEMS mirror. These are properties which are purely geometric and are not dependent on temperature, pressure or moisture. Simulations have shown that the solution approach set out is robust vis-à-vis electromagnetic interference and enables stable operation.

The circuits described herein, in particular in examples the detection circuit, the evaluation circuit and/or the driver circuit, can be implemented by arbitrary suitable integrated circuit structures, for example microprocessor circuits, ASIC circuits (ASIC=application-specific integrated circuit), CMOS circuits and the like. Depending on specific implementation requirements, examples of the circuits can be implemented using hardware and parts using software. Some examples can be implemented using a field programmable gate array (FPGA) or an ASIC, which cooperate with a microprocessor in order to achieve the methods and functionalities described herein. Generally, methods and functionalities such as described herein can be implemented in examples using an arbitrary hardware device, for example universally usable hardware, such as e.g. a computer processor, or specific hardware, such as an ASIC, for example. The implementation can be effected using a digital storage medium, for example a DVD, a Blu-Ray disk, a CD, a ROM, a PROM, an EPROM, an EEPROM or a flash memory, a hard disk or some other magnetic or optical storage unit on which are stored electronically readable control signals which can interact with a programmable computer system in such a way that the respective method or the respective functionality is achieved. In some examples, the circuits described herein can also be implemented as a programmable logic component (for example a field programmable gate array).

Although some aspects have been described in the context of a device, for example with regard to a functionality, it is clear that the aspects also represent a description of corresponding methods, wherein a block or a device can correspond to a method step or a feature of a method step. Analogously thereto, aspects described in the context of a method or method step can also constitute a description of a corresponding block or item or feature of a corresponding device. Some or all method steps can be carried out by a (or using a) hardware device, such as, for example, a microprocessor, a programmed computer or an electronic circuit. In some examples, one or more of the method steps can be carried out by such a device.

The examples described above are intended merely to illustrate the principles of the present disclosure. It goes without saying that modifications and variations of the arrangements and details described herein will become apparent to those skilled in the art. Therefore, the scope of protection is intended to be determined only by the following patent claims.

The invention claimed is:

1. A device for detecting and/or regulating an amplitude of an oscillation of an oscillatory body about an oscillation axis, wherein a change in a capacitance between at least one electrode of the oscillatory body and a stationary electrode takes place during the oscillation of the oscillatory body, wherein the device comprises:
a detection circuit to detect a signal representing a measure of the change in the capacitance; and
an evaluation circuit to:
ascertain a pulse width of a pulse in the signal before a crossing through a reference position of the oscillation;
determine information from the pulse width,
wherein the information includes a measure of a time interval between a predetermined event in the signal corresponding to an angular position of the oscillatory body, and a point in time of the crossing; and
at least one of:
calculate the amplitude from the information and an ascertained period of the oscillation, or
regulate the amplitude using the information and the ascertained period.

2. The device as claimed in claim 1, wherein the predetermined event is a temporal position of the pulse.

3. The device as claimed in claim 2, wherein the evaluation circuit is further to:
ascertain the temporal position of the pulse based on the pulse width.

4. The device as claimed in claim 1, wherein the evaluation circuit is further to:
measure a maximum value of the signal,
define a threshold using the maximum value, and
perform a threshold value comparison of the signal with the threshold; and
wherein the evaluation circuit, when ascertaining the pulse width, is to
ascertain the pulse width using a result of the threshold value comparison.

5. The device as claimed in claim 4, wherein the evaluation circuit when ascertaining the pulse width, is to:
ascertain a width between a first point in time, at which the signal exceeds the threshold, and a second point in time, at which the signal falls below the threshold.

6. The device as claimed in claim 4, wherein the evaluation circuit, when ascertaining the pulse width, is to:
ascertain a width between a first point in time, at which the signal exceeds the threshold, and a second point in time, at which the signal has the crossing through the reference position after the first point in time.

7. The device as claimed in claim 1, wherein the evaluation circuit, when ascertaining the pulse width, is to:
ascertain the pulse width by fitting a model curve to the signal.

8. The device as claimed in claim 1, wherein the device further comprises:
a monitoring unit to:
detect a maximum value of the signal in order to check whether the maximum value lies within a predetermined range, and
output a malfunction signal based on the maximum value lying outside the predetermined range.

9. A microelectromechanical system (MEMS) device comprising:
the oscillatory body to oscillate about the oscillation axis as claimed in claim 1;
the device as claimed in claim 1; and
a driver device designed to drive the oscillatory body, wherein the driver device comprises:
the at least one electrode of the oscillatory body,
the stationary electrode, and
a driver circuit designed to apply a variable voltage between the at least one electrode of the oscillatory body and the stationary electrode.

10. The MEMS device as claimed in claim 9, wherein the MEMS device further comprises a regulating circuit designed to regulate the variable voltage applied between the at least one electrode of the oscillatory body and the stationary electrode using the information.

11. The MEMS device as claimed in claim 10, wherein the regulating circuit is further designed to regulate a phase difference between the variable voltage applied between the at least one electrode of the oscillatory body and the stationary electrode and the oscillation of the oscillatory body.

12. The device as claimed in claim 1, wherein the signal is a current between the at least one electrode and the stationary electrode.

13. A device for detecting a direction in which an oscillatory body moves during an oscillation about an oscillation axis, the device comprising:
the oscillatory body comprising at least one movable electrode;
a first stationary electrode on a first side of the oscillation axis and a second stationary electrode on a second side of the oscillation axis,
wherein a first change in a first capacitance between the at least one movable electrode and the first stationary electrode and a second change in a second capacitance between the at least one movable electrode and the second stationary electrode take place during the oscillation, a detection circuit to:
  detect a first signal representing a measure of the first change in the first capacitance over time before a crossing through a reference position of the oscillation, and
  detect a second signal representing a measure of the second change in the second capacitance over time before the crossing through the reference position of the oscillation; and an evaluation circuit to:
  determine an asymmetry of a difference of the first signal and the second signal with respect to an oscillation angle, and
  determine, using the asymmetry, the direction in which the oscillatory body moves during the oscillation before the crossing through the reference position of the oscillation.

14. The device as claimed in claim 13, wherein the at least one movable electrode and/or the first stationary electrode and the second stationary electrode comprise a first layer having a first thickness and a second layer having a second thickness,
the second thickness being different than the first thickness.

15. The device as claimed in claim 13, wherein the evaluation circuit is further to:
  compare a first maximum value, associated with the first signal before the crossing through the reference position of the oscillation, and a second maximum value associated with the second signal before the crossing through the reference position of the oscillation; and
  wherein the evaluation circuit, when determining the direction, is to:
    determine the direction depending on which the first maximum value or the second maximum value is greater.

16. A microelectromechanical system (MEMS) device comprising:
  the device as claimed in claim 13; and
  another device to detect an amplitude of the oscillation of the oscillatory body,
    wherein the other device includes another evaluation circuit to determine information using a signal of the first signal and the second signal whose maximum value is lower.

17. A method for detecting and/or regulating an amplitude of an oscillation of an oscillatory body about an oscillation axis, wherein a change in a capacitance between at least one electrode of the oscillatory body and a stationary electrode takes place during the oscillation of the oscillatory body, wherein the method comprises:
  detecting a signal, representing a measure of the change in capacitance, over time;
  ascertaining a pulse width of a pulse in the signal before a crossing through a reference position of the oscillation;
  determining information from the pulse width,
    the information being a measure of a time interval between a point in time of a predetermined event in the signal, corresponding to an angular position of the oscillatory body, and a point in time of the crossing;
  determining a period of the oscillation; and
  at least one of:
    calculating the amplitude based on the information and the period of the oscillation, or
    regulating the amplitude using the information and the period of the oscillation.

18. The method as claimed in claim 17, wherein the predetermined event is a temporal position of the pulse.

19. The method as claimed in claim 18, further comprising:
  ascertaining the temporal position of the pulse based on the pulse width.

20. The method as claimed in claim 17, wherein ascertaining the pulse width comprises:
  measuring a maximum value of the signal,
  defining a threshold using the maximum value,
  performing a threshold value comparison of the signal with the threshold, and
  ascertaining the pulse width using a result of the threshold value comparison.

21. The method as claimed in claim 20, wherein the pulse width is ascertained between a first point in time, at which the signal exceeds the threshold, and a second point in time, at which the signal falls below the threshold.

22. The method as claimed in claim 20, wherein the pulse width is ascertained between a first point in time, at which the signal exceeds the threshold, and a second point in time, at which the signal has the crossing through the reference position after the first point in time.

23. The method as claimed in claim 17, wherein ascertaining the pulse width comprises fitting a model curve to the signal.

24. The method as claimed in claim 17, further comprising:
  detecting a maximum value of the signal,
  checking whether the maximum value lies within a predetermined range, and
  outputting a malfunction signal based on the maximum value lying outside the predetermined range.

25. The method as claimed in claim 17, further comprising regulating a drive voltage applied between the at least one electrode of the oscillatory body and the stationary electrode using the information.

26. The method as claimed in claim 17, wherein the signal is a current between the at least one electrode and the stationary electrode.

27. A method for detecting a direction in which an oscillatory body moves during an oscillation about an oscillation axis, wherein the oscillatory body comprises at least one movable electrode, wherein a first stationary electrode is arranged on a first side of the oscillation axis and a second stationary electrode is arranged on a second side of the oscillation axis, wherein a first change in a first capacitance between the at least one movable electrode and the first stationary electrode and a second change in a second capacitance between the at least one movable electrode and the second stationary electrode take place during the oscillation of the oscillatory body, wherein the method comprises:
  detecting a first signal representing a measure of the first change in the first capacitance over time before a crossing through a reference position of the oscillation;
  detecting a second signal representing a measure of the second change in the second capacitance over time before the crossing through the reference position of the oscillation;
  determining an asymmetry of a difference of the first signal and the second signal with respect to an oscillation angle; and determining, using the asymmetry, the direction in which the oscillatory body moves during the oscillation before the crossing through the reference position of the oscillation.

28. The method as claimed in claim 27, wherein determining the direction comprises:
- comparing a first maximum value, associated with the first signal before the crossing through the reference position of the oscillation, and a second maximum value associated with the second signal before the crossing through the reference position of the oscillation, and
- determining the direction depending on which of the first maximum value or the second maximum value is greater.

* * * * *